(12) United States Patent
Hayashi et al.

(10) Patent No.: US 9,802,402 B2
(45) Date of Patent: Oct. 31, 2017

(54) METHOD OF MANUFACTURING HEATING DEVICE BY SCREEN PRINTING

(71) Applicant: FUJI XEROX CO., LTD., Tokyo (JP)

(72) Inventors: Kazuhiro Hayashi, Kanagawa (JP); Koichi Haga, Kanagawa (JP); Shuichi Yamada, Kanagawa (JP); Mutsuya Takahashi, Kanagawa (JP); Michiaki Murata, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 15/231,949

(22) Filed: Aug. 9, 2016

(65) Prior Publication Data

US 2017/0253019 A1   Sep. 7, 2017

(30) Foreign Application Priority Data

Mar. 7, 2016  (JP) .................................. 2016-043555

(51) Int. Cl.

| | | |
|---|---|---|
| *B41F 15/34* | (2006.01) | |
| *G03G 15/20* | (2006.01) | |
| *B41F 15/08* | (2006.01) | |
| *B41M 1/40* | (2006.01) | |
| *H05K 3/12* | (2006.01) | |
| *B41M 1/12* | (2006.01) | |

(52) U.S. Cl.
CPC .......... *B41F 15/34* (2013.01); *B41F 15/0813* (2013.01); *B41F 15/0827* (2013.01); *B41F 15/0845* (2013.01); *B41F 15/0854* (2013.01); *B41F 15/0872* (2013.01); *B41F 15/0895* (2013.01); *B41M 1/12* (2013.01); *B41M 1/40* (2013.01); *G03G 15/20* (2013.01); *H05K 3/1216* (2013.01); *H05K 3/1233* (2013.01)

(58) Field of Classification Search
CPC ...... B41F 15/0872; B41F 15/34; G03G 15/20
See application file for complete search history.

(56) References Cited

U.S. PATENT DOCUMENTS

| | | | | |
|---|---|---|---|---|
| 3,249,043 | A * | 5/1966 | Karlyn ................ | B41F 15/0872 101/124 |
| 5,357,856 | A * | 10/1994 | Hasegawa ............... | B41L 13/18 101/119 |
| 2001/0032835 | A1* | 10/2001 | Murooka ............. | H05B 3/0095 219/216 |

(Continued)

FOREIGN PATENT DOCUMENTS

WO   2013/073276 A1   5/2013

*Primary Examiner* — Leslie J Evanisko
*Assistant Examiner* — Michael Robinson
(74) *Attorney, Agent, or Firm* — Sughrue Mion, PLLC

(57) ABSTRACT

A method of manufacturing a heating device includes preparing a substrate having a curved surface; and forming a heating body on the substrate, the heating body generating heat with a supply of electric current. The forming of the heating body includes pressing a screen toward the substrate with an aid of a pressing member while rotating the substrate and moving the screen, and transferring application liquid that is to form the heating body to the substrate through the screen. In the forming of the heating body, the pressing member is in contact with the screen at a position on an upstream side with respect to a transfer position in a direction of movement of the screen.

4 Claims, 14 Drawing Sheets

(56) References Cited

U.S. PATENT DOCUMENTS

| | | | | |
|---|---|---|---|---|
| 2002/0127035 A1* | 9/2002 | Otsuka | ................ | H05B 3/0095 399/329 |
| 2002/0148369 A1* | 10/2002 | Yamasaki | ............... | B41F 15/40 101/123 |
| 2009/0220288 A1* | 9/2009 | Omata | ............... | G03G 15/2042 399/333 |
| 2009/0230114 A1* | 9/2009 | Taniguchi | .......... | G03G 15/2042 219/216 |

* cited by examiner

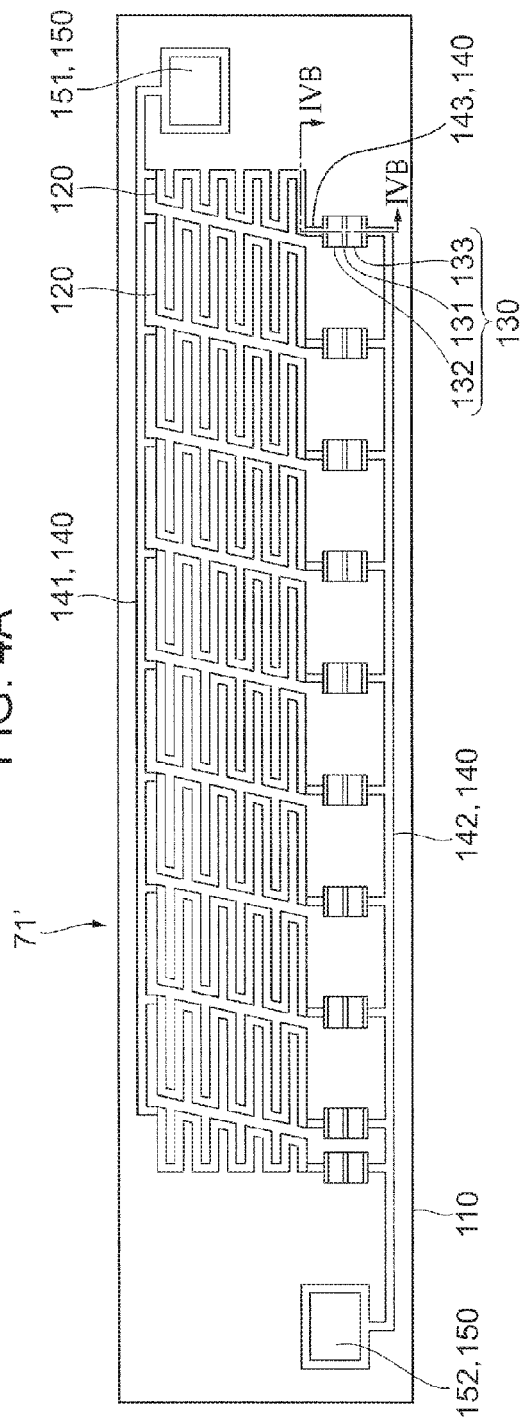
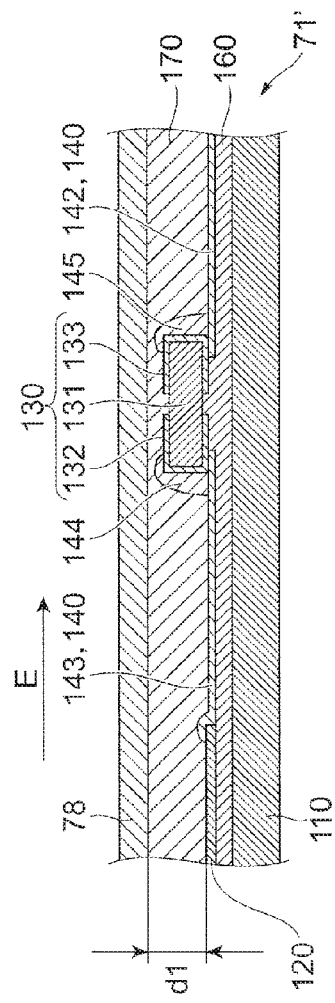
FIG. 4A
FIG. 4B

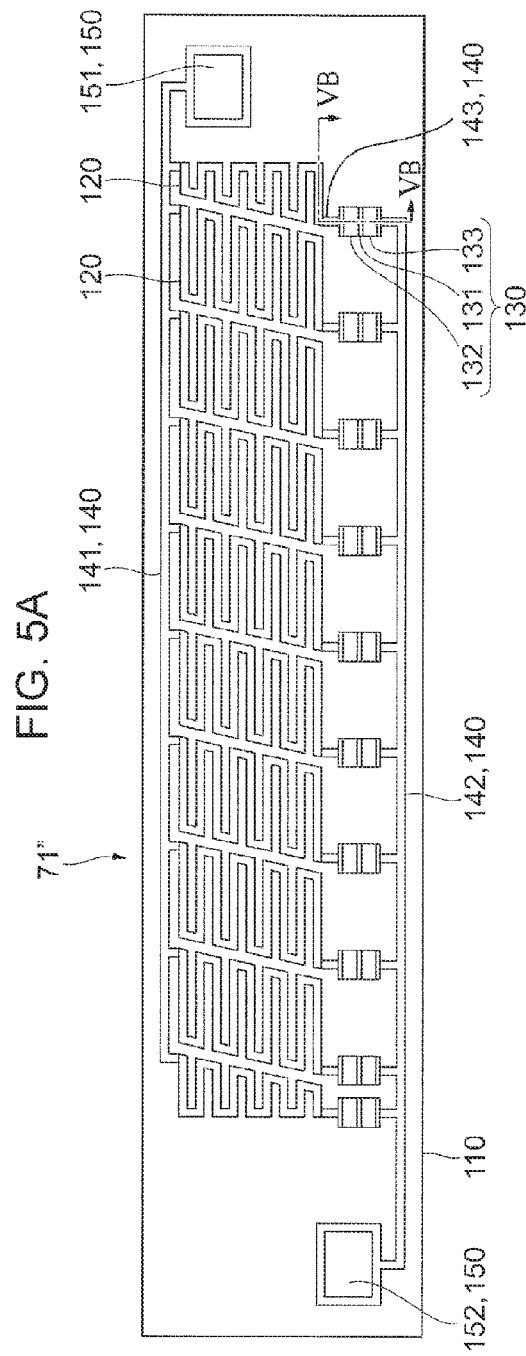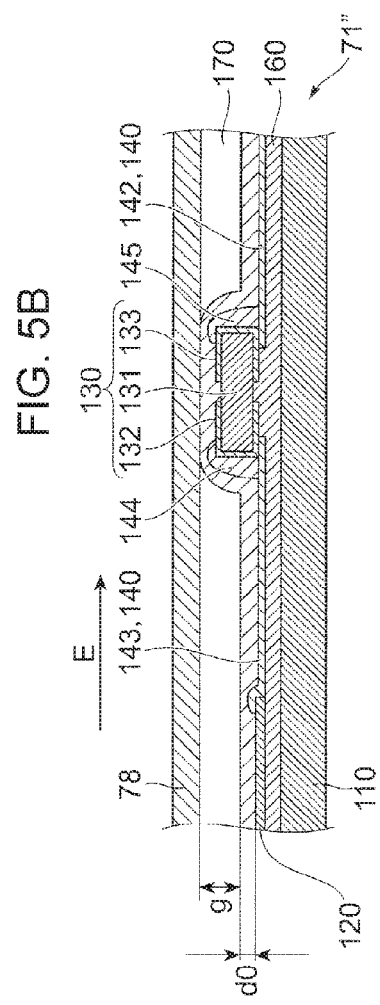

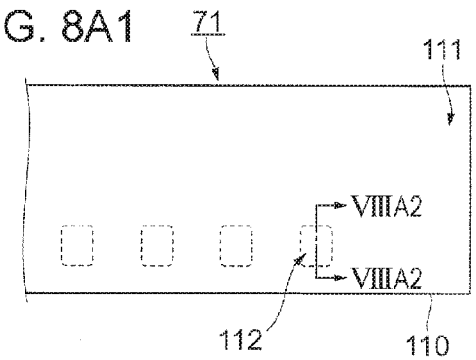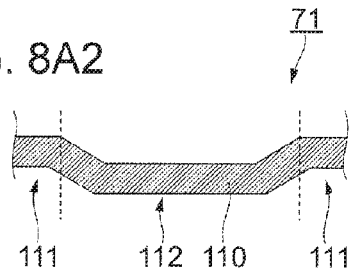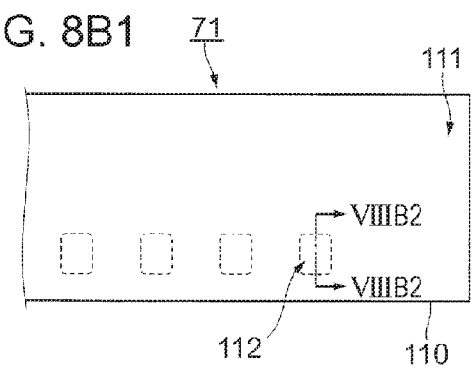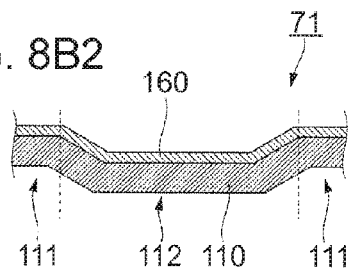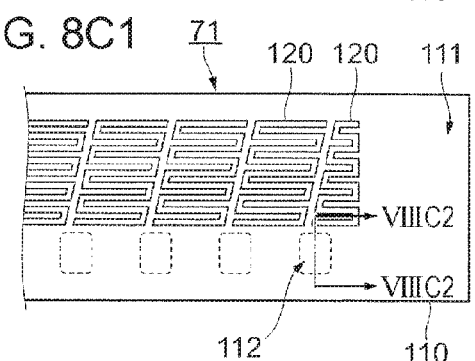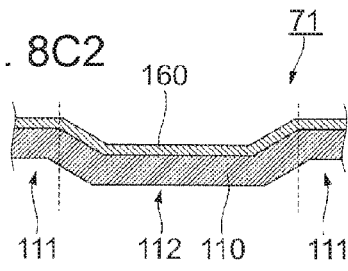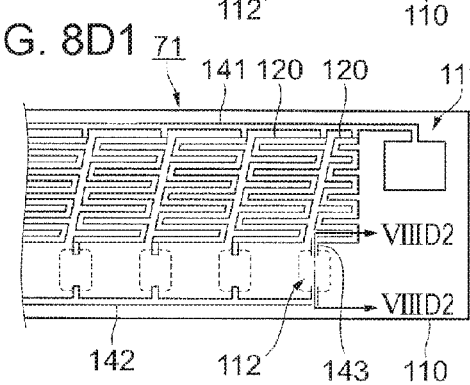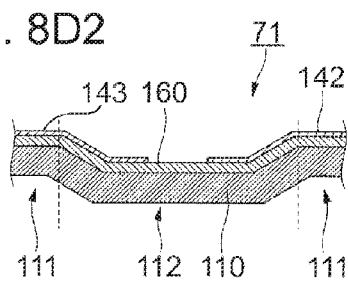

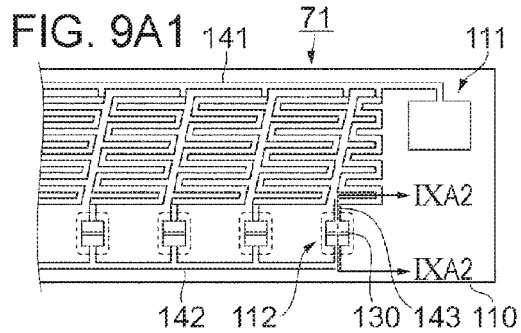
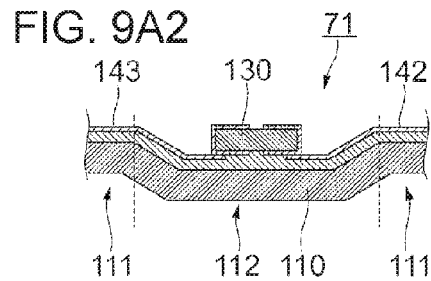
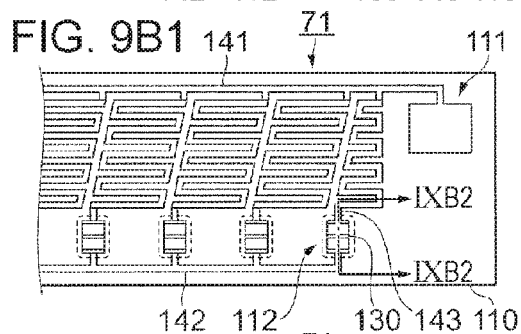
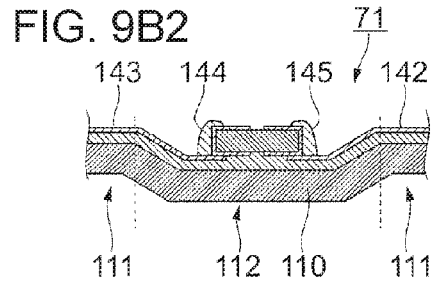
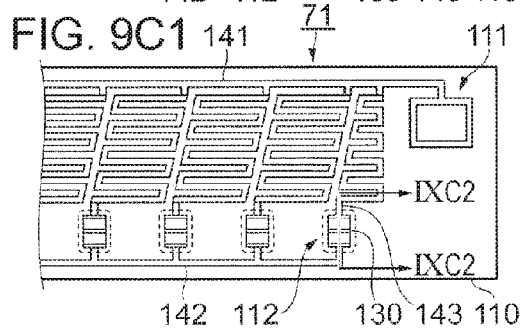
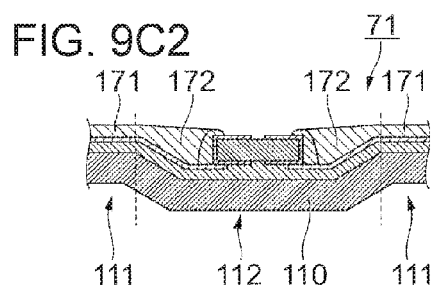
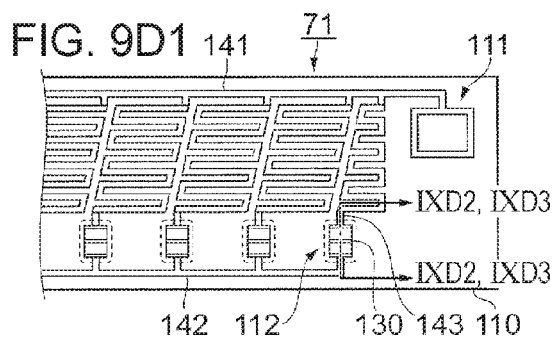
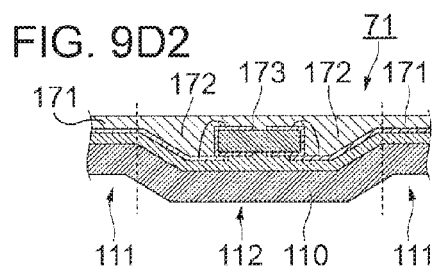
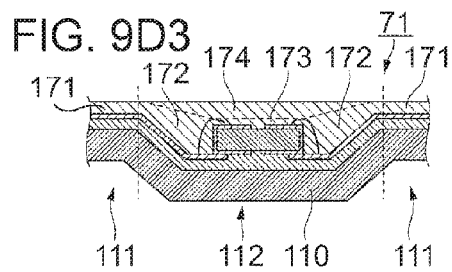

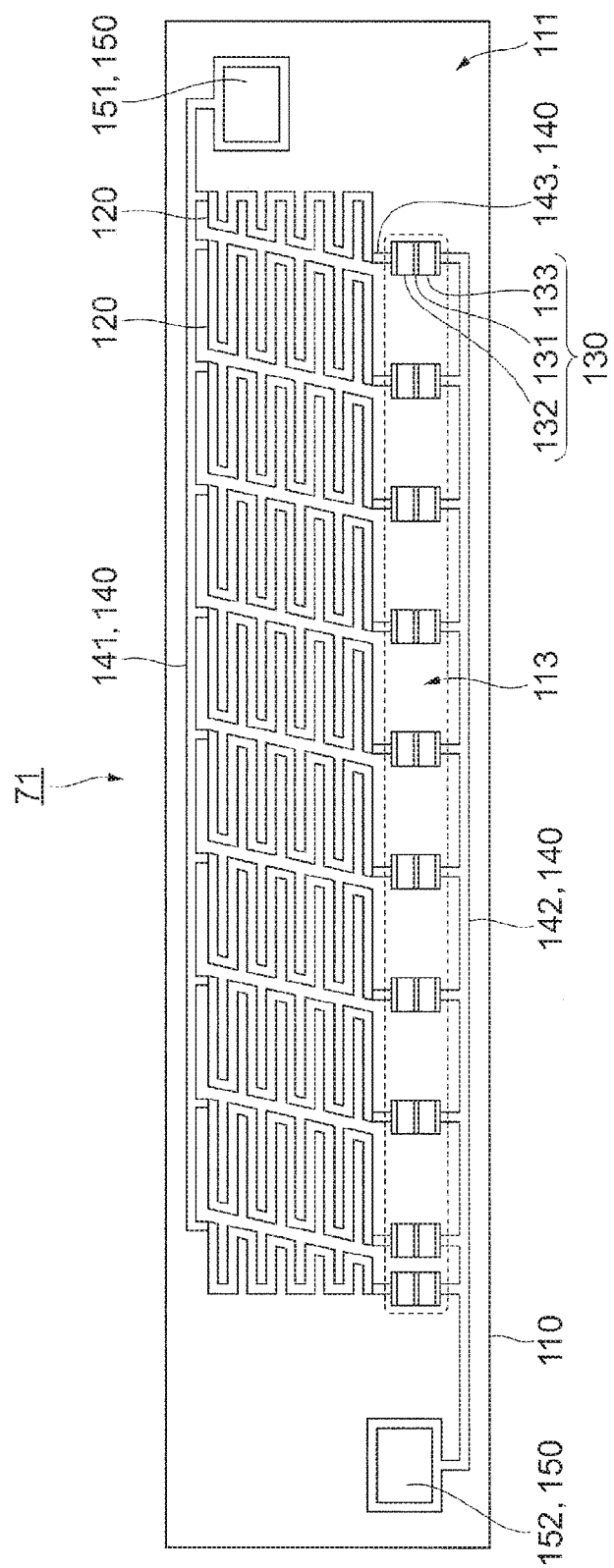

METHOD OF MANUFACTURING HEATING DEVICE BY SCREEN PRINTING

CROSS-REFERENCE TO RELATED APPLICATIONS

This application is based on and claims priority under 35 USC 119 from Japanese Patent Application No. 2016-043555 filed Mar. 7, 2016.

BACKGROUND

Technical Field

The present invention relates to a method of manufacturing a heating device, a method of manufacturing printed matter, and a screen printing device.

SUMMARY

According to an aspect of the invention, there is provided a method of manufacturing a heating device. The method includes preparing a substrate having a curved surface; and forming a heating body on the substrate, the heating body generating heat with a supply of electric current. The forming of the heating body includes pressing a screen toward the substrate with an aid of a pressing member while rotating the substrate and moving the screen, and transferring application liquid that is to form the heating body to the substrate through the screen. In the forming of the heating body, the pressing member is in contact with the screen at a position on an upstream side with respect to a transfer position in a direction of movement of the screen.

BRIEF DESCRIPTION OF THE DRAWINGS

Exemplary embodiments of the present invention will be described in detail based on the following figures, wherein:

FIG. 4A is a top view of a solid heater according to a first comparative embodiment seen in the direction of arrow IIIA illustrated in FIG. 2;

FIG. 4B is a sectional view of the solid heater taken along line IVB-IVB illustrated in FIG. 4A;

FIG. 5A is a top view of a solid heater according to a second comparative embodiment seen in the direction of arrow IIIA illustrated in FIG. 2;

FIG. 5B is a sectional view of the solid heater taken along line VB-VB illustrated in FIG. 5A;

FIGS. 8A1, 8B1, 8C1, and 8D1 are top views illustrating corresponding ones of the steps of manufacturing the solid heater;

FIGS. 8A2, 8B2, 8C2, and 8D2 are sectional views taken along respective lines VIIIA2-VIIIA2, VIIIB2-VIIIB2, VIIIC2-VIIIC2, and VIIID2-VIIID2 illustrated in FIGS. 8A1, 8B1, 8C1, and 8D1;

FIGS. 9A1, 9B1, 9C1, and 9D1 are top views illustrating corresponding ones of the steps of manufacturing the solid heater that follow the steps illustrated in FIGS. 8A1, 8B1, 8C1, and 8D1;

FIGS. 9A2, 9B2, 9C2, 9D2, and 9D3 are sectional views taken along respective lines IXA2-IXA2, IXB2-IXB2, IXC2-IXC2, IXD2-IXD2, and IXD3-IXD3 illustrated in FIGS. 9A1, 9B1, 9C1, and 9D1;

FIG. 10 is a top view of a solid heater according to a second exemplary embodiment of the present invention;

DETAILED DESCRIPTION

First Exemplary Embodiment

Image Forming Apparatus 1

Figure 1:
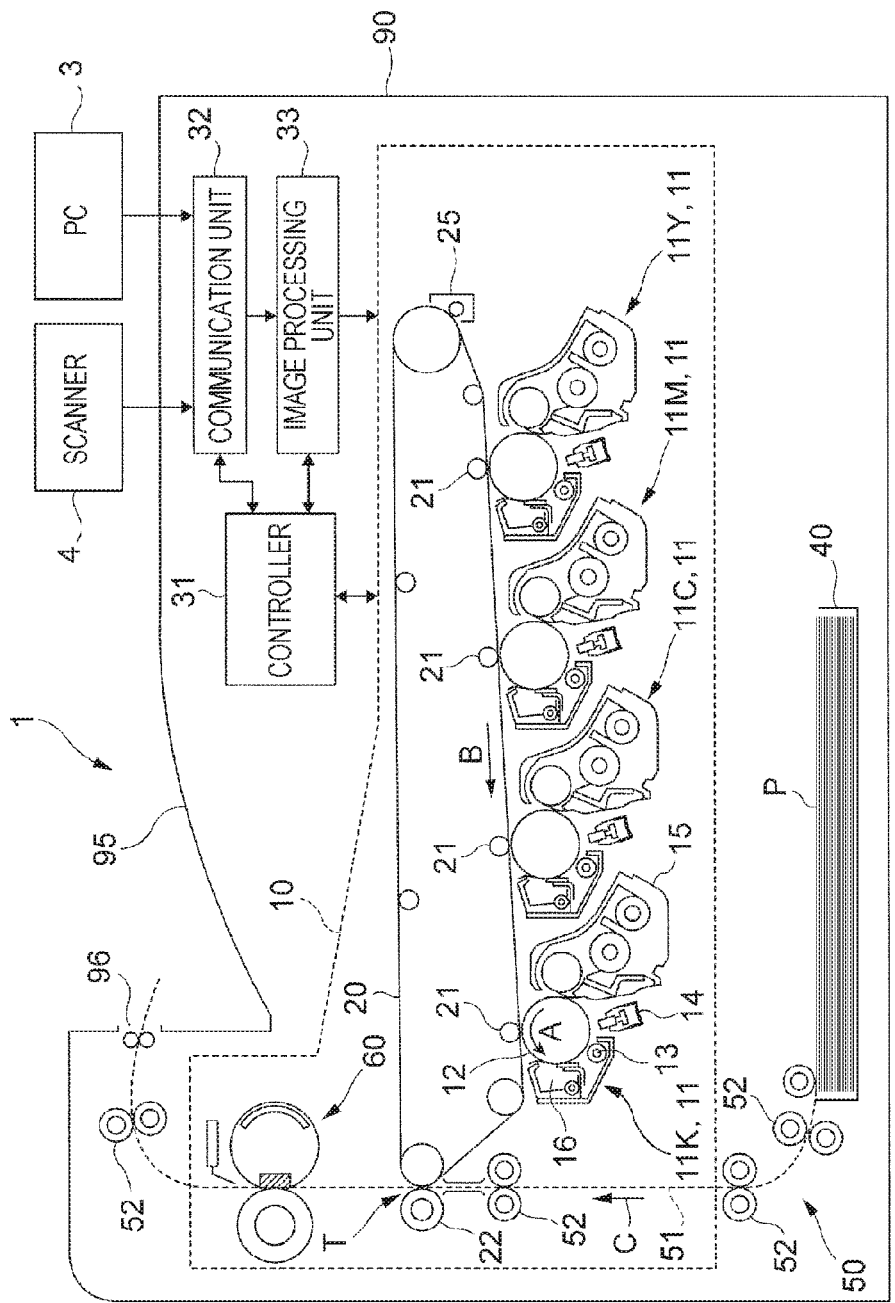
FIG. 1 is a schematic sectional view of an image forming apparatus according to a first exemplary embodiment of the present invention.

FIG. 1 is a schematic sectional view of an image forming apparatus 1 according to a first exemplary embodiment of the present invention. The image forming apparatus 1 is an electrophotographic color printer that prints images on the basis of image data.

The image forming apparatus 1 includes a body case 90, in which a sheet container unit 40 that contain sheets P (exemplary recording media), an image forming section 10 that forms an image on each of the sheets P, and a transporting section 50 that transports the sheet P from the sheet container unit 40 through the image forming section 10 up to a sheet output port 96 provided in the body case 90. The image forming apparatus 1 further includes a controller 31 that controls the entire operation of the image forming apparatus 1, a communication unit 32 that communicates with, for example, a personal computer (PC) 3 or an image reading apparatus (scanner) 4 and receives image data therefrom, and an image processing unit 33 that processes the image data received by the communication unit 32.

The sheet container unit 40 contains sheets P.

The transporting section 50 includes a sheet transport path 51 extending from the sheet container unit 40, passing through the image forming section 10, and reaching the sheet output port 96; and pairs of transport rollers 52 that transport the sheet P along the transport path 51. The transporting section 50 transports the sheet P in a direction represented by arrow C.

The image forming section 10 includes four image forming units 11Y, 11M, 11C, and 11K that are arranged at predetermined intervals. The image forming units 11Y, 11M, 11C, and 11K are hereinafter collectively referred to as "image forming units 11" if there is no need to distinguish thereamong. The image forming units 11 each include a photoconductor drum 12 on which an electrostatic latent image to be developed into a toner image is formed, a charging device 13 that charges the surface of the photoconductor drum 12 with a predetermined potential, a light-emitting-diode (LED) printhead 14 that exposes the photoconductor drum 12 charged by the charging device 13 to light emitted therefrom on the basis of a corresponding one of pieces of image data for different colors, a developing device 15 that develops the electrostatic latent image on the photoconductor drum 12 into a toner image, and a drum cleaner 16 that cleans the surface of the photoconductor drum 12 after a transfer process is performed.

The four image forming units 11Y, 11M, 11C, and 11K all have the same configuration, except toners contained in the respective developing devices 15. The image forming unit 11Y including the developing device 15 that contains a yellow (Y) toner forms a yellow toner image. Likewise, the image forming unit 11M including the developing device 15 that contains a magenta (M) toner forms a magenta toner image, the image forming unit 11C including the developing device 15 that contains a cyan (C) toner forms a cyan toner image, and the image forming unit 11K including the developing device 15 that contains a black (K) toner forms a black toner image.

The image forming section 10 further includes an intermediate transfer belt 20 to which the toner images in the respective colors on the respective photoconductor drums 12 of the respective image forming units 11 are transferred in such a manner as to be superposed one on top of another, and first transfer rollers 21 that sequentially electrostatically transfer the toner images in the respective colors formed by the respective image forming units 11 to the intermediate transfer belt 20 (first transfer). The image forming section 10 further includes a second transfer roller 22 provided in a second transfer part T and that electrostatically transfers the toner images in the respective colors superposed on the intermediate transfer belt 20 to a sheet P collectively (second transfer), and a fixing unit 60 (an exemplary fixing portion and an exemplary fixing device) that fixes the superposed toner images transferred to the sheet P in the second transfer.

The image forming apparatus 1 performs the following image forming process under the control of the controller 31. Specifically, image data transmitted from the PC 3 or the scanner 4 is received by the communication unit 32 and is processed in a predetermined manner by the image processing unit 33, whereby pieces of image data for the respective colors are generated. The pieces of image data for the respective colors are transmitted to the respective image forming units 11 provided for the respective colors. Subsequently, in the image forming unit 11K that forms a black toner image, for example, the photoconductor drum 12 rotating in a direction of arrow A is charged with a predetermined potential by the charging device 13.

Subsequently, the LED printhead 14 performs scan exposure on the photoconductor drum 12 on the basis of black image data transmitted from the image processing unit 33, whereby an electrostatic latent image corresponding to the black image data is formed on the photoconductor drum 12. The electrostatic latent image for black on the photoconductor drum 12 is then developed into a black toner image by the developing device 15. Likewise, the image forming units 11Y, 11M, and 11C form yellow (Y), magenta (M), and cyan (C) toner images, respectively.

The toner images in the respective colors thus formed on the photoconductor drums 12 of the image forming units 11 are sequentially electrostatically transferred to the intermediate transfer belt 20 by the respective first transfer rollers 21 in such a manner as to be superposed one on top of another while the intermediate transfer belt 20 is rotating in a direction of arrow B, whereby a set of superposed toner images in the respective colors is formed on the intermediate transfer belt 20.

With the rotation of the intermediate transfer belt 20 in the direction of arrow B, the set of superposed toner images on the intermediate transfer belt 20 is transported to the second transfer part T (an exemplary transfer portion). Synchronously with the transport of the set of superposed toner images to the second transfer part T, a sheet P is transported from the sheet container unit 40 in the direction of arrow C along the transport path 51 by the pairs of transport rollers 52 provided in the transporting section 50. Then, the set of superposed toner images on the intermediate transfer belt 20 is collectively electrostatically transferred, with a transfer electric field produced by the second transfer roller 22 at the second transfer part T, to the sheet P transported along the transport path 51.

Subsequently, the sheet P carrying the set of superposed toner images that has been electrostatically transferred thereto is transported along the transport path 51 to the fixing unit 60. The set of superposed toner images on the sheet P transported to the fixing unit 60 is subjected to heat and pressure applied thereto by the fixing unit 60, whereby the set of superposed toner images is fixed on the sheet P. The sheet P having the fixed set of superposed toner images is transported along the transport path 51 in the direction of arrow C and is discharged from the sheet output port 96 provided in the body case 90 onto a sheet stacking portion 95 that receives the sheet P.

Meanwhile, toner particles remaining on the photoconductor drums 12 after the first transfer and toner particles remaining on the intermediate transfer belt 20 after the second transfer are removed by the drum cleaners 16 and a belt cleaner 25.

The above image forming process performed by the image forming apparatus 1 for printing an image on a sheet P is repeated a number of times corresponding to the number of pages to be printed.

Fixing Unit 60

Figure 2:
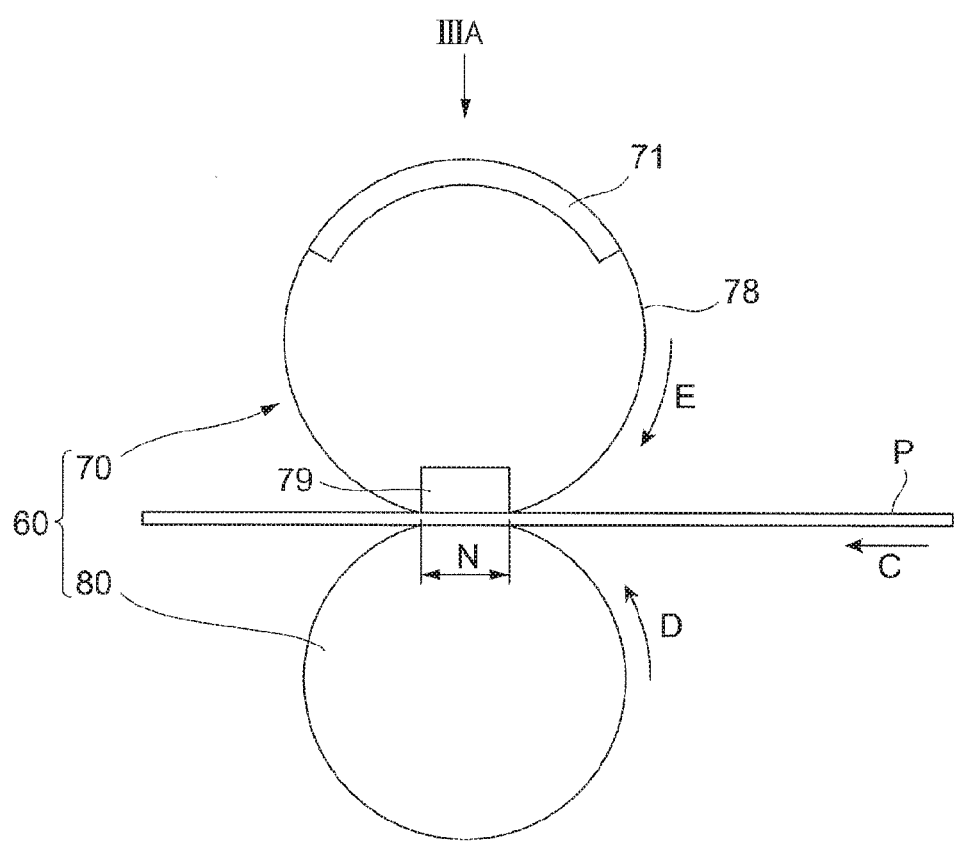
FIG. 2 is a sectional view of a fixing unit included in the image forming apparatus.

FIG. 2 is a sectional view of the fixing unit 60 included in the image forming apparatus 1.

The fixing unit 60 includes a heater unit 70 and a pressure roller 80 (an exemplary pressure member). The heater unit 70 and the pressure roller 80 each have a round columnar shape whose axis extends in the depth direction in FIG. 2.

The heater unit 70 includes a rotating fixing belt 78 (an exemplary heating object and an exemplary belt member), a heat-generating solid heater 71 (an exemplary heating member and an exemplary heating device) that has an arc or substantially arc shape in sectional view taken in the direction of rotation of the fixing belt 78, and a pressure pad 79 that is pressed by the pressure roller 80 with the fixing belt 78 interposed therebetween. The surface of the solid heater 71 only needs to have an arc or substantially arc shape in the direction of rotation of the fixing belt 78.

The solid heater 71 described below is provided in the form of a plate-like member so that the heat capacity is reduced.

The fixing belt 78 has an endless cylindrical shape, and the inner circumferential surface thereof is in contact with the outer circumferential surface of the solid heater 71 and with the pressure pad 79. The fixing belt 78 is heated by coming into contact with the solid heater 71.

The fixing belt 78 is an endless belt member whose original shape is cylindrical. For example, in the original shape (cylindrical shape), the fixing belt 78 has a diameter of 30 mm and a widthwise length of 300 mm. As described below, the fixing belt 78 deforms when pressed by the pressure pad 79. The term "original shape" used herein refers to a shape of the fixing belt 78 that is not pressed by the pressure pad 79, that is, an undeformed shape.

The fixing belt 78 includes a base layer and a release layer provided over the base layer. The base layer is a heat-resistant sheet-like member providing a certain level of mechanical strength to the fixing belt 78 as a whole. The base layer is, for example, a polyimide resin sheet having a thickness of 60 μm to 200 μm. To make the temperature distribution of the fixing belt 78 evener, a heat-conductive filler made of aluminum or the like may be added to the polyimide resin.

The release layer directly comes into contact with the set of toner images yet to be fixed on the sheet P and is therefore made of a highly releasable material. For example, any of the following: tetrafluoroethylene perfluoroalkylvinylether copolymer (PFA), polytetrafluoroethylene (PTFE), or silicone copolymer; or any combination of the foregoing materials. If the release layer is too thin, the wear resistance of the release layer is insufficient, resulting in a short life of the fixing belt 78. If the release layer is too thick, the heat capacity of the fixing belt 78 becomes too large, leading to a long warmup time. Considering the balance between the wear resistance and the heat capacity, the thickness of the release layer may be set to 1 μm to 50 μm.

In addition, an elastic layer made of silicone rubber or the like may be interposed between the base layer and the release layer.

The pressure pad 79 is made of, for example, silicone rubber or fluorocarbon rubber, or so-called engineering plastic having high mechanical strength and high heat resistance. For example, the pressure pad 79 is a rigid block member made of a material such as phenolic resin, polyimide resin, polyamide resin, polyamideimide resin, polyether ether ketone (PEEK) resin, polyether sulfone (PES) resin, polyphenylene sulfide (PPS) resin or liquid crystal polymer (LCP) resin, and a surface of the pressure pad 79 that is in contact with the fixing belt 78 has a substantially arc shape in sectional view. The pressure pad 79 is supported by a frame (not illustrated) on the inner side of the fixing belt 78. The pressure pad 79 is fixedly provided in an area where the pressure roller 80 presses the fixing belt 78, and extends in the axial direction of the pressure roller 80 over the entirety of the area. The pressure pad 79 presses the pressure roller 80 with the fixing belt 78 interposed therebetween and at a predetermined load (for example, an average of 10 kgf) evenly over the entirety of an area having a predetermined width.

The pressure roller 80 is provided against the fixing belt 78 and rotates at a process speed of, for example, 140 mm/s in a direction of arrow D illustrated in FIG. 2 by following the rotation of the fixing belt 78. The pressure roller 80 and the pressure pad 79 are pressed against each other with the fixing belt 78 interposed therebetween, whereby a nip part (press-fixing part) N is formed.

The pressure roller 80 includes, for example, a core (columnar core metal), a heat-resistant elastic layer provided over the core, and a release layer provided over the elastic layer. The core is made of solid stainless steel or aluminum and has a diameter of 18 mm. The elastic layer is made of silicone sponge or the like and has a thickness of, for example, 5 mm. The release layer is a heat-resistant resin coating, such as PFA containing carbon, or a heat-resistant rubber coating. The release layer has a thickness of, for example, 50 μm. Thus, the pressure roller 80 presses the pressure pad 79, with the fixing belt 78 interposed therebetween, at a load of, for example, 25 kfg with the aid of a pressing spring (not illustrated).

The sheet P transported to the nip part N by the transporting section 50 (see FIG. 1) is heated by the fixing belt 78 at the nip part N and is pressed between the pressure pad 79 and the pressure roller 80 together with the fixing belt 78. Thus, the set of unfixed superposed toner images carried by the sheet P is fixed.

At the nip part N, the sheet P that is in contact with the pressure roller 80 is moved in the direction of arrow C with the rotation of the pressure roller 80 in the direction of arrow D. The movement of the sheet P causes the fixing belt 78 that is in contact with the sheet P to rotate in a direction of arrow E (a direction of forward rotation).

Solid Heater 71

Figure 3A:
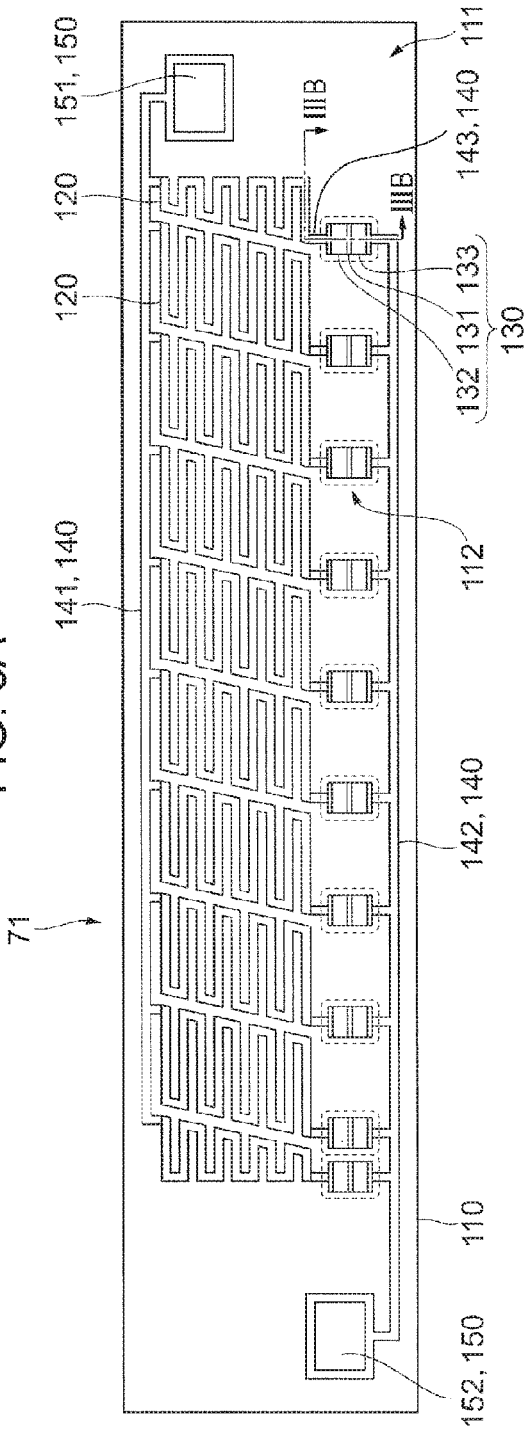
FIG. 3A is a top view of a solid heater according to the first exemplary embodiment seen in a direction of arrow IIIA illustrated in FIG. 2.
Figure 3B:
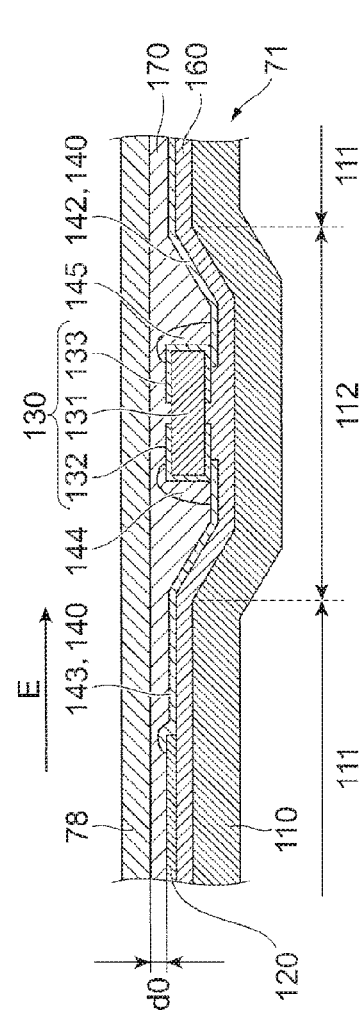
FIG. 3B is a sectional view of the solid heater taken along line IIIB-IIIB illustrated in FIG. 3A.

FIGS. 3A and 3B illustrate the solid heater 71 according to the first exemplary embodiment. FIG. 3A is a top view of the solid heater 71 seen in a direction of arrow IIIA illustrated in FIG. 2. FIG. 3B is a sectional view of the solid heater 71 taken along line IIIB-IIIB illustrated in FIG. 3A.

As illustrated in FIG. 2, the solid heater 71 has an arc or substantially arc shape in the section taken in the direction of rotation of the fixing belt 78. However, the solid heater 71 illustrated in FIG. 3B is flat, because FIG. 3B illustrates only a part of the solid heater 71. The solid heater 71 may have a circular ark shape in sectional view.

Referring to FIG. 3A, a configuration on the upper side of the solid heater 71 will now be described. The solid heater 71 includes plural resistive heating bodies 120 (exemplary heating bodies), plural positive-temperature-coefficient (PTC) elements 130 (exemplary resistive elements each having a positive temperature coefficient), wiring lines 140 connecting the foregoing elements, terminals 150 connected to the wiring lines 140, and a substrate 110 supporting the forgoing elements. The resistive heating bodies 120, the PTC elements 130, the wiring lines 140, and the terminals 150 are all provided on one side of the substrate 110.

The resistive heating bodies 120 are each made of, for example, AgPd with a high ratio of Pd. When an electric current is supplied to the resistive heating body 120, the resistive heating body 120 generates heat.

The PTC elements 130 are each a resistive element whose resistance increases with the rise of temperature. The PTC element 130 is occasionally referred to as thermistor having a positive temperature coefficient. A body portion 131 of the PTC element 130 is made of, for example, barium titanate ($BaTiO_3$) containing a very small amount of rare earth or the like. When the temperature of the body portion 131 goes over the Curie point, the resistance of the PTC element 130 rapidly increases.

The PTC element 130 is of a chip type and has a size of, for example, 2 mm (length) by 2 mm (width) by 0.2 mm (thickness). The PTC element 130 further includes an electrode 132 and an electrode 133 that are provided in advance on two respective sides (on the upper and lower sides in FIG. 3A, and on the left and right sides in FIG. 3B) of the body portion 131. The electrodes 132 and 133 are made of, for example, Ag provided on a Ni plate serving as an underlayer.

In an environment with no rise of temperature, the resistance value of the PTC element 130 is determined by the distance between the electrodes 132 and 133. Specifically, in the environment with no rise of temperature, the shorter the distance between the electrodes 132 and 133, the smaller the resistance of the PTC element 130.

While the electrodes 132 and 133 illustrated in FIG. 3B each have a rectangular U shape extending around the body portion 131, the electrodes 132 and 133 may each have another shape. For example, the electrodes 132 and 133 may each extend only over a side face and a top face of the body portion 131. The electrodes 132 and 133 only need to be electrically connected to wiring lines 143 and 142, respectively, with the aid of connection wiring lines 144 and 145, respectively, which will be described later.

The wiring lines 140 are each made of, for example, AgPd with a low ratio of Pd. The wiring lines 140 include a wiring line 141 provided on the upper side in FIG. 3A, the wiring line 142 provided on the lower side in FIG. 3A, and the wiring lines 143 each provided between a corresponding one of the resistive heating bodies 120 and a corresponding one of the PTC elements 130. As illustrated in FIG. 3B, the wiring lines 140 further include the wiring lines 144 each connecting a corresponding one of the wiring lines 143 and the electrode 132 of a corresponding one of the PTC elements 130 to each other, and the wiring lines 145 each connecting the wiring line 142 and the electrode 133 of a corresponding one of the PTC elements 130 to each other. The wiring lines 144 and 145 are occasionally referred to as connection electrodes.

In FIGS. 3A and 3B, the wiring lines 141 to 143 are denoted by 141,140, 142,140, and the like. If there is no need to distinguish the wiring lines 141 to 145 from one another, the wiring lines are denoted by 140.

Each of the resistive heating bodies 120 and a corresponding one of the PTC elements 130 are electrically connected in series and are thus paired. The pairs of the resistive heating bodies 120 and the PTC elements 130 are connected in parallel between the wiring line 141 and the wiring line 142.

The wiring lines 140 will be described later with reference to FIG. 3B.

The terminals 150 are each an exposed portion of a corresponding one of the wiring lines 140 (the wiring lines 141 and 142), the exposed portion not being covered with a protective layer 170 (see FIG. 3B referred to later). The terminals 150 include a terminal 151 provided at an end of the wiring line 141, and a terminal 152 connected to the wiring line 142. In FIG. 3A, the terminals 151 and 152 are denoted by 151,150 and 152,150, respectively.

The terminals 150 are each a part of a corresponding one of the wiring lines 140 (the wiring lines 141 and 142) that is widened for easy connection to a wire provided for the supply of an electric current.

When a voltage is applied between the terminal 151 and the terminal 152, a current flows through each of the pairs of the resistive heating bodies 120 and the PTC elements 130 that are electrically connected in series. Thus, the resistive heating bodies 120 generate heat.

The voltage applied between the terminal 151 and the terminal 152 is, for example, an alternating current (AC) of 100 V.

The resistive heating bodies 120 that are at the left and right ends, respectively, in FIG. 3A have different shapes from the other resistive heating bodies 120, because no heat needs to be generated in regions of the solid heater 71 that correspond to regions of the fixing belt 78 where the sheet P does not pass. That is, the length of an area between the resistive heating bodies 120 at the left and right ends inclusive corresponds to the maximum width of the sheet P that is handleable by the image forming apparatus 1. The resistive heating bodies 120 at the left and right ends may have the same shape as the other resistive heating bodies 120.

Now, functions of the PTC elements 130 will be described.

The PTC elements 130 each have a resistance that increases with the rise of temperature. Hence, when the solid heater 71 is heated to a temperature at or above a predetermined level by the resistive heating bodies 120, the resistances of the PTC elements 130 increase and restrict the current flowing through the resistive heating bodies 120 connected in series to the respective PTC elements 130. Therefore, the amount of heat generated by the resistive heating bodies 120 is reduced, and the temperature of the resistive heating bodies 120 drops. Accordingly, the resistances of the PTC elements 130 decrease. Then, the current flowing through the resistive heating bodies 120 increases, and the temperature of the resistive heating bodies 120 rises. That is, the PTC elements 130 suppress the overheating of the solid heater 71.

When the sheet P is heated by the fixing belt 78 at the nip part N of the fixing unit 60, the fixing belt 78 is deprived of heat by the sheet P. Hence, the temperature of the fixing belt 78 drops. The fixing belt 78 whose temperature has dropped is reheated to a predetermined temperature by the solid heater 71.

However, if a sheet P whose width is smaller than the maximum width is transported to the fixing unit 60, some regions of the fixing belt 78 are kept out of contact with the sheet P and are not deprived of heat by the sheet P. Such regions of the fixing belt 78 that are kept out of contact with the sheet P remain heated and are eventually reaches a temperature above the predetermined level by the solid heater 71 (the regions are overheated). In such an event, not only the fixing belt 78 but also the solid heater 71 is overheated.

To prevent such a situation, the solid heater 71 according to the first exemplary embodiment includes the plural resistive heating bodies 120 that are separate from one another and are arranged side by side in the longitudinal direction of the solid heater 71, with the PTC elements 130 connected in series to the respective resistive heating bodies 120.

Accordingly, in the overheated regions of the fixing belt 78 where the sheet P is out of contact, the resistances of the PTC elements 130 increase and thus restrict the current flowing through the resistive heating bodies 120, whereby further overheating of the solid heater 71 and the fixing belt 78 is suppressed.

Meanwhile, in the region of the fixing belt 78 where the sheet P is in contact, the current flowing through the resistive heating bodies 120 is not restricted. Therefore, the solid heater 71 and the fixing belt 78 continue to be heated.

Hence, the PTC elements 130 need to be provided near the respective resistive heating bodies 120 on the substrate 110 of the solid heater 71. Therefore, in the solid heater 71 according to the first exemplary embodiment, the PTC elements 130 are provided in respective recesses 112 provided near the respective resistive heating bodies 120.

Referring now to FIG. 3B, a sectional configuration of the solid heater 71 will be described. The substrate 110 of the solid heater 71 has the recesses 112 in a surface thereof on one side that faces the fixing belt 78 and in regions thereof where the PTC elements 130 are mounted. The other regions, excluding the recesses 112, of the surface of the substrate 110 are referred to as flat or substantially flat portions 111 (hereinafter simply referred to as the flat portions 111). The substrate 110 is provided with an insulating layer 160 spreading evenly thereover. That is, the insulating layer 160 is provided with a substantially uniform thickness on the flat portions 111 and in the recesses 112 of the substrate 110. The resistive heating bodies 120, the wiring lines 140 (the wiring lines 141, 142, 143, 144, and 145), and the PTC elements 130 are provided on the insulating layer 160. The resistive heating bodies 120 are provided on the flat portions 111 of the substrate 110. The PTC elements 130 are provided in the recesses 112 of the substrate 110.

The wiring line 141 is connected to a first end of each of the resistive heating bodies 120 (see FIG. 3A). The wiring line 142 extends up to a position below the electrode 133 of each of the PTC elements 130. A first end of each of the wiring lines 143 is connected to a second end of a corresponding one of the resistive heating bodies 120. A second end of each of the wiring lines 143 extends up to a position below the electrode 132 of a corresponding one of the PTC elements 130.

The wiring lines 144 each connect a corresponding one of the wiring lines 143 and the electrode 132 of a corresponding one of the PTC elements 130 to each other at a side face and/or the top face of the PTC element 130. Likewise, the wiring lines 145 each connect the wiring line 142 and the electrode 133 of a corresponding one of the PTC elements 130 to each other at a side face and/or a top face of the PTC element 130.

Note that FIG. 3B does not illustrate the wiring line 141, which is provided outside the region illustrated in FIG. 3B.

The protective layer 170 is provided over the resistive heating bodies 120, the PTC elements 130, and the wiring lines 140.

The surface of the protective layer 170 (a side farther from the substrate 110) is even and smooth (level or substantially level, hereinafter simply referred to as level) with suppressed irregularities, as to be described later.

The substrate 110 is made of, for example, stainless steel (SUS). The recesses 112 of the substrate 110 are provided by performing pressing at respective positions where the PTC elements 130 are to be mounted.

The substrate 110 may be made of a metal material other than stainless steel (SUS). For example, the substrate 110 may be made of aluminum or copper. Alternatively, the substrate 110 may be made of a ceramic material that is baked in such a manner as to have the recesses 112, or may be made of a heat-resistant plastic material that is shaped in such a manner as to have the recesses 112.

If the substrate 110 is made of a conductive metal material such as stainless steel (SUS), the insulating layer 160 suppresses the occurrence of electrical short circuit between the substrate 110 and the resistive heating bodies 120, the PTC elements 130, and the wiring lines 140 (the wirings 141, 142, and 143). If the substrate 110 is made of an insulating material such as ceramic, the insulating layer 160 may be omitted. Hence, a combination of the substrate 110 and the insulating layer 160 may be referred to as the substrate, and the resistive heating bodies 120 and the PTC elements 130 provided on the insulating layer 160 may be regarded as being provided on the substrate.

If the substrate 110 is made of heat-resistant metal such as stainless steel (SUS), the insulating layer 160 is made of, for example, a glass material. If the insulating layer 160 is made of a glass material, the insulating layer 160 may be also referred to as underglaze.

The protective layer 170 prevents the elements such as the resistive heating bodies 120 and the PTC elements 130 from coming into direct contact with the fixing belt 78. That is, the protective layer 170 is provided over the resistive heating bodies 120 and the PTC elements 130 and thus protects the resistive heating bodies 120 and the PTC elements 130. For example, to allow the fixing belt 78 and the solid heater 71 to smoothly slide against each other, lubricant such as silicone oil may be supplied to the contact part between the solid heater 71 and the fixing belt 78. In such a case, unless the protective layer 170 is provided, electrical short circuit may occur between the elements such as the resistive heating bodies 120 and the PTC elements 130.

If the substrate 110 is made of heat-resistant metal such as stainless steel (SUS), the protective layer 170 is made of, for example, a glass material. If the protective layer 170 is made of a glass material, the protective layer 170 may be also referred to as overglaze.

In the solid heater 71 according to the first exemplary embodiment, as illustrated in FIG. 3B, regions of the protective layer 170 that are above the resistive heating bodies 120 each have a thickness d0. That is, the distance between the fixing belt 78 and each of the resistive heating bodies 120 is equal to the thickness d0 of each of the regions of the protective layer 170 that are above the resistive heating bodies 120.

The thickness of the protective layer 170 is not uniform. As to be described later, regions of the protective layer 170 that are around the respective PTC elements 130 are thicker than the other regions of the protective layer 170. Thus, the protective layer 170 has an even and smooth (level) surface with suppressed irregularities.

Since the PTC elements 130 are placed in the respective recesses 112 and the surface of the protective layer 170 is made even and smooth (level) with suppressed irregularities, the distance between the fixing belt 78 and each of the resistive heating body 120 is set to d0.

To form the insulating layer 160 or the protective layer 170 from a glass material, glass paste in which glass particles are dispersed is applied to the substrate 110, and the glass paste is heated so as to be softened (fused) and to be fluidized (to undergo viscous flow). In such a method, since the glass particles that are softened are fused together, the insulating layer 160 or the protective layer 170 comes to have a finer structure, with the surface thereof being even and smooth (level) having suppressed irregularities by undergoing viscous flow.

The insulating layer 160 has a thickness of, for example, 15 μm to 70 μm. The resistive heating bodies 120 and the wiring lines 140 each have a thickness of 10 μm to 30 μm. The PTC elements 130 each have a thickness of about 0.2 mm, as described above.

That is, the depth of the recesses 112 provided in the substrate 110 is set so as to be slightly greater than the thickness of the PTC elements 130. For example, if the thickness of the PTC elements 130 is 0.2 mm, the depth of the recesses 112 is set to 0.25 mm. Thus, the PTC elements 130 are embedded in the respective recesses 112.

Then, the protective layer 170 is formed in such a manner as to have an even and smooth (level) surface with suppressed irregularities.

The PTC elements 130 do not necessarily need to be completely embedded in the recesses 112. The surface irregularities of the protective layer 170 only need to be reduced with the presence of the recesses 112.

As described above, the fixing belt 78 includes the base layer made of, for example, polyimide resin and is therefore easily deformable. Hence, unless the contact between the fixing belt 78 and the solid heater 71 is hindered, the surface of the protective layer 170 at the recesses 112 does not need to be flat and parallel to the flat portions 111 and may be concave toward the substrate 110 or convex from the substrate 110.

The fixing belt 78 and the solid heater 71 only need to smoothly slide against each other so that heat efficiently conducts from the solid heater 71 to the fixing belt 78.

That is, the phrase "an even and smooth (level) surface with suppressed irregularities" encompasses that the surface of the protective layer 170 at the recesses 112 is convex or concave.

FIGS. 4A and 4B illustrate a solid heater 71' according to a first comparative embodiment. FIG. 4A is a top view of the solid heater 71' seen in the direction of arrow IIIA illustrated in FIG. 2. FIG. 4B is a sectional view of the solid heater 71' taken along line IVB-IVB illustrated in FIG. 4A.

As illustrated in FIG. 4A, the substrate 110 of the solid heater 71' has no recesses 112. As illustrated in FIG. 4B, the protective layer 170 has a thickness dl so as to have a flat (even and smooth) surface with the PTC elements 130 embedded therein. That is, the distance between the fixing belt 78 and each of the resistive heating bodies 120 is equal to the thickness dl of the protective layer 170. The thickness dl is greater than the thickness d0 of the protective layer 170 included in the solid heater 71 according to the first exemplary embodiment illustrated in FIGS. 3A and 3B.

In the solid heater 71' according to the first comparative embodiment, the contact surface between the fixing belt 78 and the solid heater 71' is an even and smooth (level) surface with suppressed irregularities, as with the solid heater 71 according to the first exemplary embodiment. Therefore, the fixing belt 78 and the solid heater 71' smoothly slide against each other.

However, in the solid heater 71' according to the first comparative embodiment, since the protective layer 170 is as thick as the thickness dl and has a large heat capacity, it takes a long time and a large amount of energy to heat the protective layer 170. In addition, the long distance between the fixing belt 78 and each of the resistive heating bodies 120 lowers the efficiency in the heat conduction from the resistive heating bodies 120 to the fixing belt 78.

Moreover, a large amount of glass material that is necessary for forming the protective layer 170 increases the manufacturing cost.

FIGS. 5A and 5B illustrate a solid heater 71" according to a second comparative embodiment. FIG. 5A is a top view of the solid heater 71" seen in the direction of arrow IIIA illustrated in FIG. 2. FIG. 5B is a sectional view of the solid heater 71" taken along line VB-VB illustrated in FIG. 5A.

As illustrated in FIG. 5A, the substrate 110 of the solid heater 71" has no recesses 112. As illustrated in FIG. 5B, the protective layer 170 has the thickness d0 in regions thereof above the resistive heating bodies 120. However, since the PTC elements 130 are not embedded in the substrate 110, the PTC elements 130 project toward the outer side (toward the fixing belt 78) with respect to the resistive heating bodies 120. That is, there are gaps, i.e., a distance g, between the fixing belt 78 and the protective layer 170 in areas around the PTC elements 130 and above the resistive heating bodies 120. The gaps prevent the heat conduction from the resistive heating bodies 120 to the fixing belt 78 and lower the efficiency in the heat conduction from the resistive heating bodies 120 to the fixing belt 78.

As described above, the fixing belt 78 is made of a material that is easy to deform but is difficult to completely conform to the convex shape of each of the PTC elements 130. Therefore, if the fixing belt 78 is slid against the solid heater 71" including the convex PTC elements 130, the fixing belt 78 tends to be damaged.

That is, the solid heater 71" is not suitable for the fixing unit 60.

As described above, the solid heater 71 according to the first exemplary embodiment includes the substrate 110 having the recesses 112, in which the PTC elements 130 are placed, respectively, with the protective layer 170 having an even and smooth (level) surface with suppressed irregularities. Hence, the PTC elements 130 are prevented from projecting toward the fixing belt 78. Furthermore, the thickness (thickness d0) of the protective layer 170 in the regions above the resistive heating bodies 120, i.e., the distance between the fixing belt 78 and each of the resistive heating bodies 120, is small. Thus, the efficiency in the heat conduction from the resistive heating bodies 120 to the fixing belt 78 is improved.

Since the protective layer 170 provided over the resistive heating bodies 120 is thin, the time required to heat the solid heater 71 to a predetermined temperature is reduced, and the power consumption by the solid heater 71 is therefore reduced. In addition, the fixing time in the image forming process is reduced.

Method of Manufacturing Solid Heater 71

Figure 6:
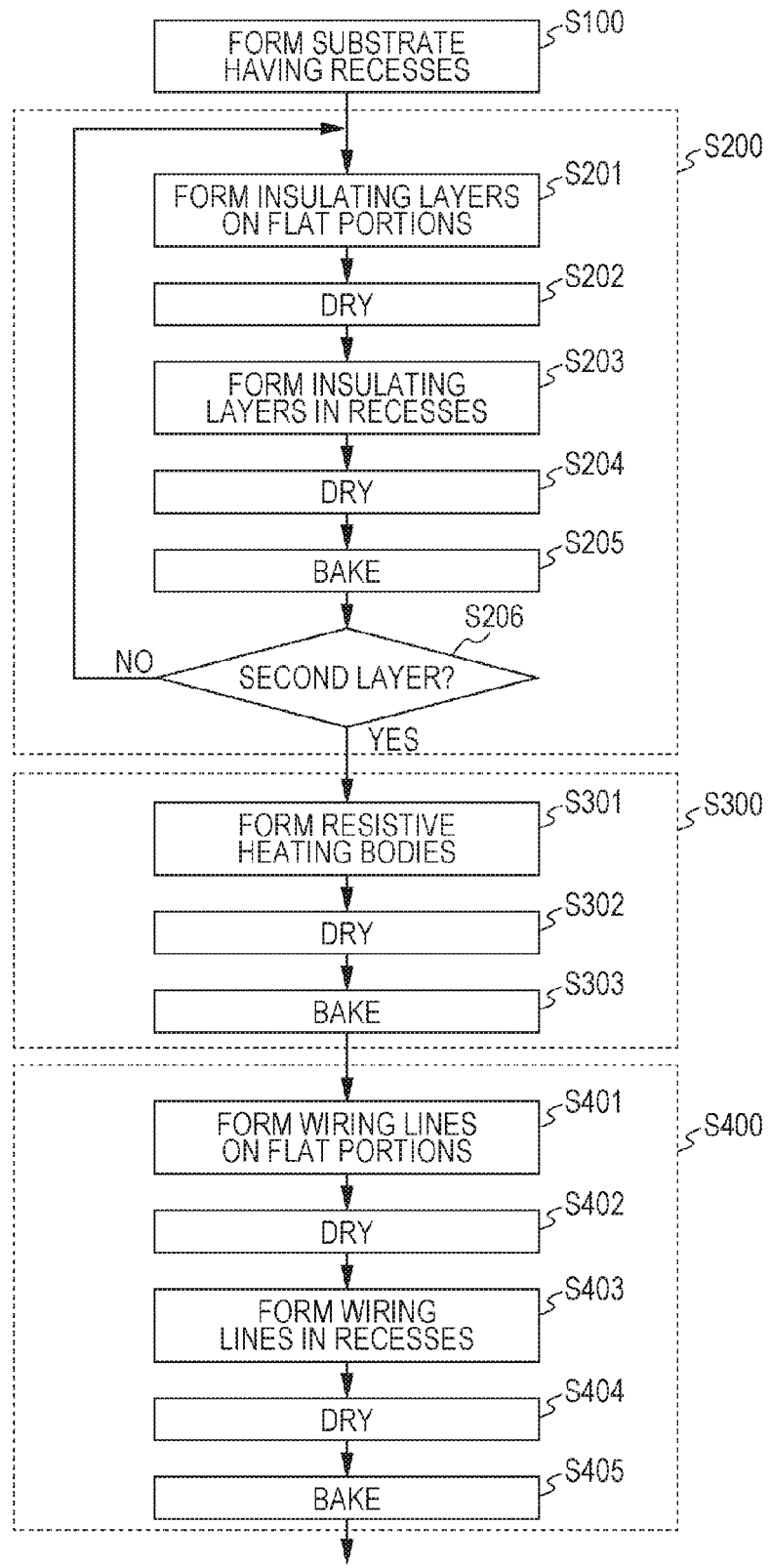
FIG. 6 is a flow chart illustrating exemplary steps of manufacturing the solid heater.

FIG. 6 is a flow chart illustrating exemplary steps of manufacturing the solid heater 71.

Figure 7:
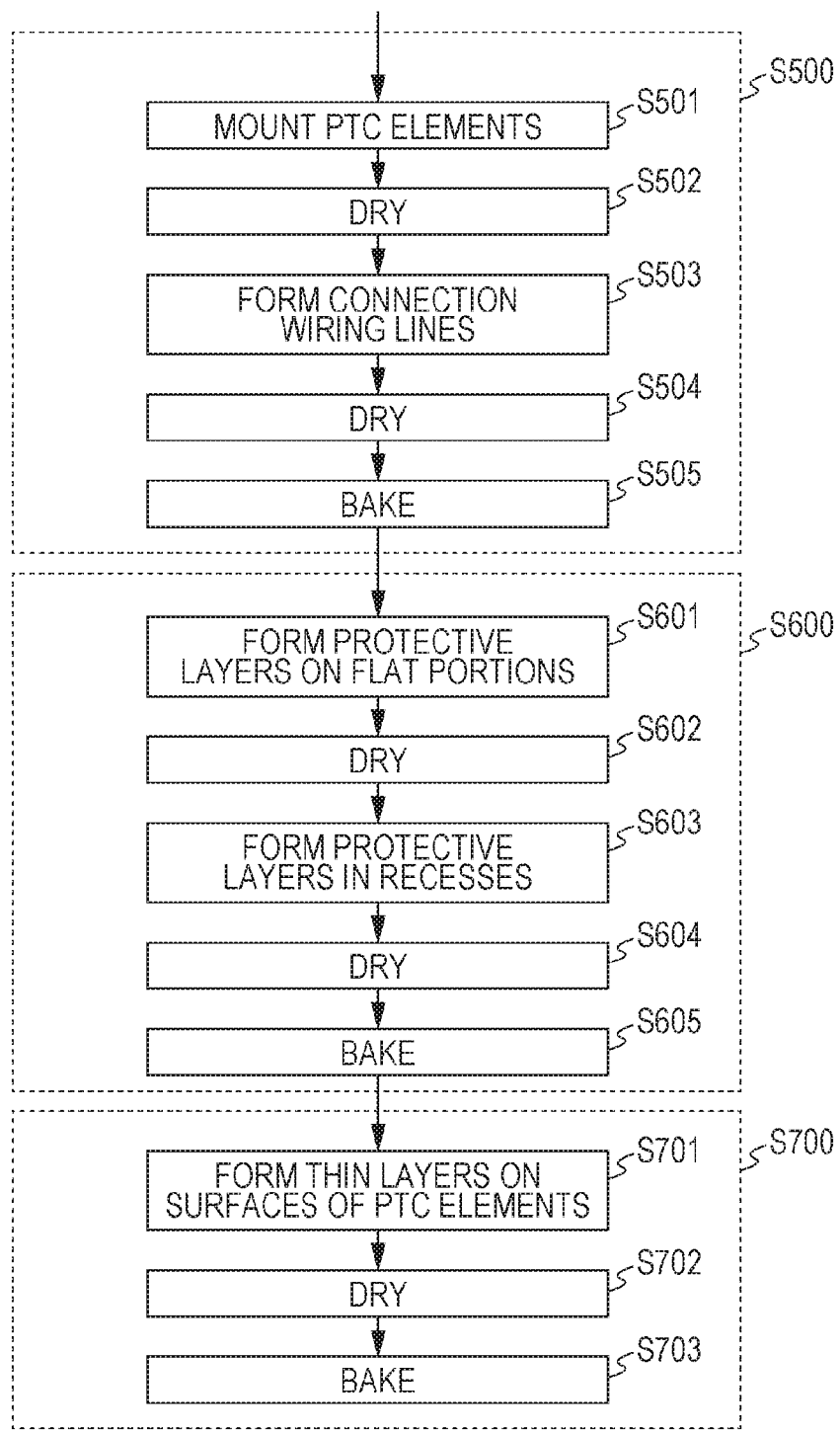
FIG. 7 is a flow chart illustrating other exemplary steps of manufacturing the solid heater that follow the steps illustrated in FIG. 6.

FIG. 7 is a flow chart illustrating other exemplary steps of manufacturing the solid heater 71 that follow the steps illustrated in FIG. 6.

FIGS. 8A1, 8B1, 8C1, and 8D1 are top views illustrating corresponding ones of the steps of manufacturing the solid heater 71. FIGS. 8A2, 8B2, 8C2, and 8D2 are sectional views taken along respective lines VIIIA2-VIIIA2, VIIIB2-VIIIB2, VIIIC2-VIIIC2, and VIIID2-VIIID2 illustrated in FIGS. 8A1, 8B1, 8C1, and 8D1.

FIGS. 9A1, 9B1, 9C1, and 9D1 are top views illustrating corresponding ones of the steps of manufacturing the solid heater 71 that follow the steps illustrated in FIGS. 8A1, 8B1, 8C1, and 8D1. FIGS. 9A2, 9B2, 9C2, 9D2, and 9D3 are sectional views taken along respective lines IXA2-IXA2, IXB2-IXB2, IXC2-IXC2, IXD2-IXD2, and IXD3-IXD3 illustrated in FIGS. 9A1, 9B1, 9C1, and 9D1.

Since FIGS. 8A2, 8B2, 8C2, 8D2, 9A2, 9B2, 9C2, 9D2, and 9D3 each illustrate only a part of the substrate 110 where one of the PTC elements 130 is to be placed, the substrate 110 is illustrated as a flat member.

Referring to FIGS. 6 to 9D3, a method of manufacturing the solid heater 71 will now be described.

The method of manufacturing the solid heater 71 according to the first exemplary embodiment includes, as illustrated in FIG. 6, a step of forming a substrate having recesses (step S100) in which the substrate 110 having the recesses 112 is formed, a step of forming an insulating layer (step S200) in which the insulating layer 160 is formed, a step of forming resistive heating bodies (step S300) in which the resistive heating bodies 120 are formed, and a step of forming wiring lines (step S400) in which the wiring lines 140 (the wiring lines 141, 142, and 143) are formed. The method of manufacturing the solid heater 71 further includes, as illustrated in FIG. 7, a step of mounting resistive elements (step S500) in which the PTC elements 130 are mounted on the substrate 110, a step of forming a protective layer around the resistive elements (step S600) in which the protective layer 170 is formed around each of the PTC elements 130, and a step of sealing the resistive elements (step S700) in which the PTC elements 130 are each sealed by the protective layer 170 provided over the surface of the PTC element 130.

A combination of the step of forming a protective layer around the resistive elements (step S600) and the step of sealing the resistive elements (step S700) is occasionally referred to as a step of forming a protective layer.

In the step of forming a substrate having recesses (step S100 illustrated in FIG. 6 and FIGS. 8A1 and 8A2), for example, a plate of stainless steel (SUS) is cut into the shape of the solid heater 71, and the cut plate is bent into an arc or substantially arc shape in sectional view. Furthermore, the plate is pressed such that recesses 112 are provided at a time at respective positions where the PTC elements 130 are to be mounted. The order of performing the above processes of cutting the plate into the shape of the solid heater 71, bending the plate into an arc or substantially arc shape, and providing the recesses 112 is arbitrary.

Thus, as illustrated in FIGS. 8A1 and 8A2, a substrate 110 having recesses 112 is obtained.

Subsequently, in the step of forming an insulating layer (step S200 illustrated in FIG. 6 and FIGS. 8B1 and 8B2), an insulating layer 160 made of, for example, a glass material is formed. The glass material is glass paste (exemplary application liquid) and is applied to the substrate 110.

The glass paste contains glass particles, a binder that keeps the glass particles to be suspended therein, and a solvent that adjusts the viscosity of the glass paste. The glass particles are particles of a glass material whose composition has been adjusted such that the glass particles are softened at a predetermined temperature. The binder is ethyl cellulose or the like and suppresses the cohesion of the glass particles.

The glass paste that is to form the insulating layer 160 is applied to the flat portions 111 of the substrate 110 by screen printing or the like (step S201 in FIG. 6). Screen printing is a method of forming a film of glass paste on the substrate 110 by extruding the glass paste through a screen having openings by using a squeegee.

To level (planarize) the surface of the glass paste by utilizing the fluidity of the glass paste, the film of the glass paste is left for a predetermined period of time (a leveling step). Subsequently, to evaporate the solvent, the film of the glass paste is dried in, for example, an electric oven that is set at a temperature at which the solvent evaporates (step S202 in FIG. 6).

Other drying steps to be described below are the same as the above drying step, and redundant description thereof is omitted.

Subsequently, the glass paste is further applied to the recesses 112 of the substrate 110 by using a tool such as a dispenser or a jet dispenser (step S203 in FIG. 6). The recesses 112 each have a depth of, for example, 0.25 mm. Therefore, it is difficult to bring the screen used in screen printing into contact with the bottom of each of the recesses 112. That is, the glass paste extruded through the screen is difficult to adhere to the bottom of each of the recesses 112. Hence, it is difficult to apply the glass paste with a uniform thickness in each of the recesses 112. In view of such a situation, the application of the glass paste to the recesses 112 is performed by using a dispenser or a jet dispenser.

The dispenser employs a method of ejecting the glass paste from a nozzle and applying the glass paste in a pattern of lines or spots. Hence, it is possible to apply the glass paste to the bottom of each of the recesses 112.

The jet dispenser employs a method of ejecting the glass paste from a pressurize nozzle in a pattern of lines or spots. Hence, in the case of the jet dispenser, the glass paste is ejected in the form of smaller droplets and by a longer distance than in the case of the above dispenser.

That is, the glass paste is applied to the flat portions 111 and to the recesses 112 in different manners.

Furthermore, to level the surface of the glass paste by utilizing the fluidity of the glass paste, the glass paste is left for a predetermined period of time (a leveling step) and is then dried so that the solvent is evaporated (step S204 in FIG. 6).

Subsequently, the glass paste applied to the flat portions 111 and to the recesses 112 is baked so that the glass particles are fused or softened to be integrated together. Specifically, the glass paste is baked (step S205 in FIG. 6) at a temperature predetermined on the basis of the characteristic of the glass particles contained in the glass paste. The baking is performed in an atmosphere containing oxygen, such as air (an oxygen atmosphere). Thus, the binder such as ethyl cellulose burns into $CO_2$ and is removed. Furthermore, the glass particles are softened (fused) and are integrated together, thereby forming a fine glass film.

Other baking steps to be described below are the same as the above baking step, and redundant description thereof is omitted.

Subsequently, whether or not steps S201 to S205 performed are for a second layer (second time) is checked (step S206 in FIG. 6). If steps S201 to S205 performed are for a first layer (first time), steps S201 to S205 are performed again for the second layer (second time). If it is determined in step S206 that steps S201 to S205 performed are for the second layer (second time), the step of forming an insulating layer (step S200) ends, and the process proceeds to the step of forming resistive heating bodies (step S300 in FIG. 6).

In the step of forming an insulating layer (step S200 in FIG. 6), steps S201 to S205 are performed twice so that two insulating layers 160 are formed. This is because of the following reason. If the insulating layer 160 is provided at a time (in one layer) and if that insulating layer 160 has any holes (pinholes), short circuits between the substrate 110 and the resistive heating bodies 120 and the wiring lines 140 (the wiring lines 141, 142, and 143) that are to be provided on the insulating layer 160 may occur through such holes (pinholes). Particularly, in a method in which the glass paste is ejected in lines or spots by using a dispenser or a jet dispenser, holes (pinholes) tend to occur between the lines or spots of the glass paste.

Hence, two insulating layers 160 are formed so that any holes (pinholes) in the first layer are covered with the second layer, whereby the occurrence of short circuits is suppressed.

Thus, the insulating layer 160 is formed on the substrate 110 as illustrated in FIGS. 8B1 and 8B2.

Subsequently, in the step of forming resistive heating bodies (step S300 illustrated in FIG. 6 and FIG. 8C1), resistive heating bodies 120 made of, for example, AgPd are formed. The resistive heating bodies 120 are not included in the section illustrated in FIG. 8C2.

As illustrated in FIG. 8C1, the resistive heating bodies 120 are formed on the flat portions 111 of the substrate 110. Therefore, resistive-heating-body paste containing AgPd with a high ratio of Pd is applied to the flat portions 111 by screen printing (step S301 in FIG. 6).

As with the glass paste, the resistive-heating-body paste contains AgPd, a binder, a solvent, and so forth. The resistive-heating-body paste may further contain glass particles so as to have improved adhesiveness with respect to the insulating layer 160.

Hence, the resistive-heating-body paste applied to the flat portions 111 of the substrate 110 by screen printing is left for a predetermined period of time so as to be leveled, and is dried in an oven or the like that is set at a predetermined temperature so that the solvent is evaporated (step S302 in FIG. 6).

Then, the resistive-heating-body paste is baked at a predetermined temperature (step S303 in FIG. 6).

Subsequently, in the step of forming wiring lines (step S400 illustrated in FIG. 6 and FIGS. 8D1 and 8D2), wiring lines 140 (wiring lines 141, 142, and 143) made of, for example, AgPd are formed. The wiring line 141 is not included in the section illustrated in FIG. 8D2.

First, wiring-line paste containing AgPd with a high ratio of Ag and that is to form the wiring line 141, some portions of the wiring line 142, and some portions of the wiring lines 143 is applied to the flat portions 111 of the substrate 110 by screen printing (step S401 in FIG. 6). As with the resistive-heating-body paste, the wiring-line paste contains AgPd, a binder, a solvent, and so forth. The wiring-line paste may further contain glass particles so as to have improved adhesiveness with respect to the insulating layer 160.

Then, after a leveling step is performed, the wiring-line paste is dried so that the solvent is evaporated (step S402 in FIG. 6).

Subsequently, the wiring-line paste that is to form other portions of the wiring lines 140 (the remaining portions of the wiring lines 142 and 143 that are to be formed in the recesses 112) are applied to the recesses 112 of the substrate 110 by using a dispenser or a jet dispenser (step S403 in FIG. 6). The wiring lines 140 in the recesses 112 are formed while the wiring-line paste applied to the flat portions 111 is observed through a microscope or the like. Thus, the wiring lines 140 formed on the flat portions 111 and the wiring lines 140 formed in the recesses 112 are precisely connected to each other. If the positions of the wiring lines 140 are recognized from an image taken by the microscope, the formation of the wiring lines 140 may be performed automatically.

Then, after a leveling step is performed, the wiring-line paste is dried so that the solvent is evaporated (step S404 in FIG. 6).

Furthermore, the wiring-line paste is baked (step S405 in FIG. 6), whereby the wiring lines 140 (the wiring lines 141, 142, and 143) are obtained.

Thus, as illustrated in FIGS. 8D1 and 8D2, the wiring lines 140 (the wiring lines 141, 142, and 143) are formed on the substrate 110. The wiring line 141 is not included in the section illustrated in FIG. 8D2.

Subsequently, in the step of mounting resistive elements (step S500 illustrated in FIG. 7 and FIGS. 9A1 and 9A2), PTC elements 130 are placed in the respective recesses 112 of the substrate 110.

First, insulating glass paste is applied to positions in the recesses 112 of the substrate 110 where PTC elements 130 are to be placed. The application of the insulating glass paste may be performed by using a dispenser or a jet dispenser. Then, PTC elements 130 are placed on the glass paste (step S501 in FIG. 7), and the glass paste is dried so that the solvent contained in the glass paste is evaporated (step S502 in FIG. 7).

Subsequently, wiring lines 144 that each connect the electrode 132 of a corresponding one of the PTC elements 130 and a corresponding one of the wiring lines 143 to each other and wiring lines 145 that each connect the electrode 133 of a corresponding one of the PTC elements 130 and the wiring line 142 to each other are formed (step S503 in FIG. 7). The wiring lines 144 and 145 are formed by ejecting connection-wiring-line paste from a dispenser or a jet dispenser. As with the wiring-line paste, the connection-wiring-line paste contains AgPd, a binder, a solvent, and so forth.

The positions where the wiring lines 144 and 145 are to be formed may be determined by observing the position of ejection from the dispenser or the jet dispenser through a microscope or the like. Then, after a leveling step is performed, the connection-wiring-line paste is dried so that the solvent is evaporated (step S504 in FIG. 7).

Furthermore, the glass paste provided for the mounting of the PTC elements 130 on the substrate 110 and the connection-wiring-line paste that is to form the wiring lines 144 and 145 are baked (step S505 in FIG. 7).

Considering the heat-resistant temperature (about 600° C.) of the PTC elements 130, the glass paste for fixing the PTC elements 130 to the substrate 110 and the connection-wiring-line paste may be baked at or below the heat-resistant temperature of the PTC elements 130.

Subsequently, the step of forming a protective layer around the resistive elements (step S600 illustrated in FIG. 7 and FIGS. 9C1 and 9C2) is performed. As with the case of the insulating layer 160, portions of the protective layer 170 above the flat portions 111 of the substrate 110 and portions of the protective layer 170 above the recesses 112 are formed in different manners.

First, glass paste that is to form protective layers 171 (see FIG. 9C2) as portions of the protective layer 170 is applied to the flat portions 111 of the substrate 110 by screen printing or the like (step S601 in FIG. 7). Note that the glass paste is not applied to portions of the wiring lines 141 and 142 that are to become the terminals 150 (the terminals 151 and 152).

Then, after a leveling step is performed, the glass paste is dried (step S602 in FIG. 7).

Subsequently, glass paste that is to form protective layers 172 as remaining portions of the protective layer 170 is applied to areas around the PTC elements 130 placed in the recesses 112. The PTC elements 130 are placed in the respective recesses 112 provided in the substrate 110. Hence, there are gaps around the PTC elements 130. Therefore, the gaps around the PTC elements 130 are filled with the glass paste ejected from a dispenser or a jet dispenser (step S603 in FIG. 7). In this step, the glass paste is not applied to (the upper surfaces of) the PTC elements 130. That is, the tops of the body portions 131 of the PTC elements 130 are kept uncovered with the glass paste. The reason for this will be described later.

Then, after a leveling step is performed, the glass paste is dried (step S604 in FIG. 7).

If the glass paste is applied only to the recesses 112 in which the PTC elements 130 are placed, a part of the surface of each of the PTC elements 130 only needs to be kept uncovered, with the other part of the surface of the PTC element 130 being covered with the glass plate.

Subsequently, the glass paste provided above the flat portions 111 and around the PTC elements 130 in the recesses 112 is baked (step S605 in FIG. 7).

Thus, as illustrated in FIGS. 9C1 and 9C2, the protective layers 171 and 172 as portions of the protective layer 170 are formed in areas excluding the upper surfaces of the PTC elements 130 and the portions of the wiring lines 141 and 142 that are to become the terminals 151 and 152.

Subsequently, the step of sealing the resistive elements (step S700 illustrated in FIG. 7 and FIGS. 9D1 and 9D2) is performed.

Glass paste that is to form protective layers 173 as portions of the protective layer 170 is thinly applied to the surfaces of the PTC elements 130 (step S701 in FIG. 7) that have not been covered with the glass paste in the step of forming a protective layer around the resistive elements. In this step also, the glass paste may be ejected from a dispenser or a jet dispenser.

Then, after a leveling step is performed, the glass paste is dried (step S702 in FIG. 7), and the glass paste is baked (step S703 in FIG. 7).

Thus, the PTC elements 130 are covered with the protective layer 170 (the protective layers 172 and 173).

Second Exemplary Embodiment

In the first exemplary embodiment, the substrate 110 has the recesses 112 provided at the respective positions where the PTC elements 130 are placed.

In a second exemplary embodiment, a continuous recess 113 is provided in the substrate 110 in a mounting area for the plural PTC elements 130 such that the continuous recess 113 receives the plural PTC elements 130.

The second exemplary embodiment is the same as the first exemplary embodiment except the solid heater 71. Therefore, a solid heater 71 according to the second exemplary embodiment will now be described.

Solid Heater 71

FIG. 10 is a top view of the solid heater 71 according to the second exemplary embodiment seen in the direction of arrow IIIA illustrated in FIG. 2.

As illustrated in FIG. 10, the PTC elements 130 are arranged along one longitudinal side (the lower side in FIG. 10) of the substrate 110 and side by side in the longitudinal direction of the substrate 110, and a portion of the substrate 110 where the PTC elements 130 are arranged is shaped as the continuous recess 113.

The continuous recess 113 has a larger size than each of the recesses 112 according to the first exemplary embodiment. That is, the continuous recess 113 is formable with lower accuracy than the recess 112. Hence, it is easier to process the substrate 110 in providing the continuous recess 113 than in providing the recess 112.

It is not necessary to place all the PTC elements 130 in one continuous recess 113. Two or more PTC elements 130 may be placed in one continuous recess 113.

The solid heater 71 according to the second exemplary embodiment is manufacturable by the method of manufacturing the solid heater 71 according to the first exemplary embodiment. Therefore, description of the manufacturing method is omitted.

In the case of the continuous recess 113, gaps between the PTC elements 130 are filled with the protective layers 172 (see FIGS. 9C and 9D2) included in the protective layer 170. Hence, to manufacture the solid heater 71 according to the second exemplary embodiment, a larger amount of glass paste that is to form the protective layer 170 is necessary than in the case of manufacturing the solid heater 71 according to the first exemplary embodiment.

In the solid heater 71 according to each of the first and second exemplary embodiments, the insulating layer 160 and the protective layer 170 are each formed by baking the glass paste in an atmosphere containing oxygen.

Instead of the glass paste, paste containing insulating ceramic particles may be used, and the paste may be baked in an atmosphere containing oxygen, whereby the insulating layer 160 and/or the protective layer 170 may be formed. The baking in an atmosphere containing oxygen allows the binder, such as ethyl cellulose, to burn and to be removed. Therefore, the ceramic particles are sintered together.

In the solid heater 71 according to each of the first and second exemplary embodiments, the PTC element 130 is connected in series to each of all resistive heating bodies 120. However, it is not necessary to connect the PTC elements 130 to the resistive heating bodies 120 in an area corresponding to a portion of the fixing belt 78 where the sheet P always passes regardless of the size of the sheet P.

Description of Screen Printing

As described above, the substrate 110 is bent by pressing or the like. Therefore, the outer peripheral surface of the substrate 110 has a curved shape, and screen printing needs to be performed on the curved surface.

Hence, a screen printing device 200 according to the second exemplary embodiment is configured as follows.

Figures 11A, 11B:
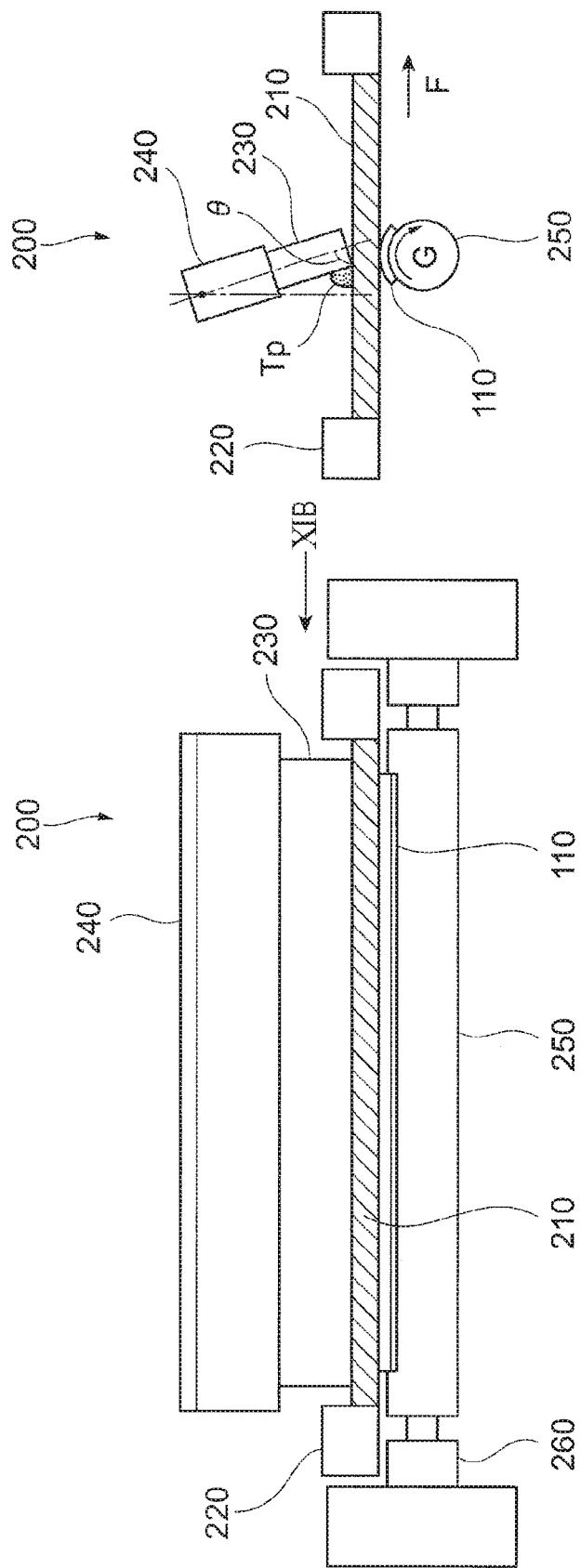
FIGS. 11A and 11B illustrate a screen printing device used in performing screen printing in the second exemplary embodiment.

FIGS. 11A and 11B illustrate the screen printing device 200 that is used in performing screen printing in the second exemplary embodiment. FIG. 11A is a front view of the screen printing device 200. FIG. 11B is a side view of the screen printing device 200 seen in a direction of arrow XIB illustrated in FIG. 11A.

The screen printing device 200 illustrated in FIGS. 11A and 11B includes a screen 210, a screen holder 220, a squeegee 230, a squeegee holder 240, a substrate holder 250, and a substrate rotating mechanism 260.

The screen 210 includes a piece of meshed cloth or the like (hereinafter referred to as the mesh), and a photosensitive film provided thereover. The mesh is made of a material such as polyester, silk, or stainless steel. The photosensitive film is formed from photosensitive liquid that is exposed to light through a mask having a pattern with which printing is desired to be performed. Thus, portions of the photosensitive liquid that have been exposed to light are hardened and stay on the mesh, thereby forming the photosensitive film. In contrast, portions of the photosensitive liquid that have not been exposed to light are not hardened and are removed in a developing step performed thereafter. Consequently, openings (not illustrated) where the mesh is exposed are provided at the portions not having been exposed to light. Therefore, the application liquid is allowed to pass through the mesh at the openings and to move toward the substrate 110. In closed portions (not illustrated) of the mesh where the photosensitive film is present, the application liquid is not allowed to move toward the substrate 110. The application liquid referred to herein is, for example, the resistive-heating-body paste used for forming the resistive heating bodies 120 in the step of forming heating bodies (step S300 in FIG. 6). The application liquid is denoted by Tp in FIG. 11B.

The screen holder 220 is a member that holds the screen 210 and is a rectangular frame member made of wood, aluminum, or the like. In the second exemplary embodiment, the screen 210 is subjected to tensile forces generated by the screen holder 220 in four directions heading toward the four respective sides of the rectangular shape of the screen holder 220, whereby the screen 210 is retained to be flat without wrinkles.

The screen holder 220 includes a moving mechanism (not illustrated) that allows the screen holder 220 to move in the lateral (horizontal) direction in FIG. 11B. Thus, the screen 210 held by the screen holder 220 is also movable in the lateral (horizontal) direction, which is a predetermined direction.

The squeegee 230 is an exemplary pressing member and presses the screen 210 toward the substrate 110, thereby transferring the application liquid to the substrate 110 through the screen 210. As illustrated in FIGS. 11A and 11B, the squeegee 230 is provided at a position across the screen 210 from the substrate 110. Although details of the squeegee 230 will be described later, the squeegee 230 is positioned in such a manner as to be in contact with the screen 210 at a position on the upstream side with respect to the transfer position in the direction of movement of the screen 210.

The squeegee holder 240 holds the squeegee 230 such that the squeegee 230 is tilted at a predetermined angle (a squeegee angle θ) toward the upstream side in the direction of movement of the screen 210. In other words, the squeegee holder 240 holds the squeegee 230 such that one end of the squeegee 230 is positioned on the upstream side, in the direction of movement of the screen 210, with respect to the other end of the squeegee 230 that is in contact with the screen 210.

The substrate holder 250 holds the substrate 110. As described above, the substrate 110 has a curved shape. Therefore, the substrate holder 250 has, for example, a circular shape in sectional view, in conformity with the shape of the substrate 110. In the second exemplary embodiment, the substrate holder 250 has a roll-like shape.

The substrate rotating mechanism 260 rotates the substrate holder 250. Thus, the substrate 110 held by the substrate holder 250 is also rotated in the same way.

In such a configuration, the rotation of the substrate 110 and the movement of the screen 210 are in synchronization with each other. That is, the peripheral speed of the outer peripheral surface of the substrate 110 and the speed of movement of the screen 210 are equal to each other. In other words, the screen 210 moves in the lateral (horizontal) direction by following the rotation of the substrate 110.

To embody such a configuration, the substrate holder 250 and the screen holder 220 may be connected to each other with the aid of elements such as a rack and a pinion so that the substrate holder 250 and the screen holder 220 move synchronously with each other. Alternatively, the speed of rotation of the substrate holder 250 and the speed of movement of the screen holder 220 may each be adjusted by using a device such as an encoder or a microcomputer.

Figure 12A:
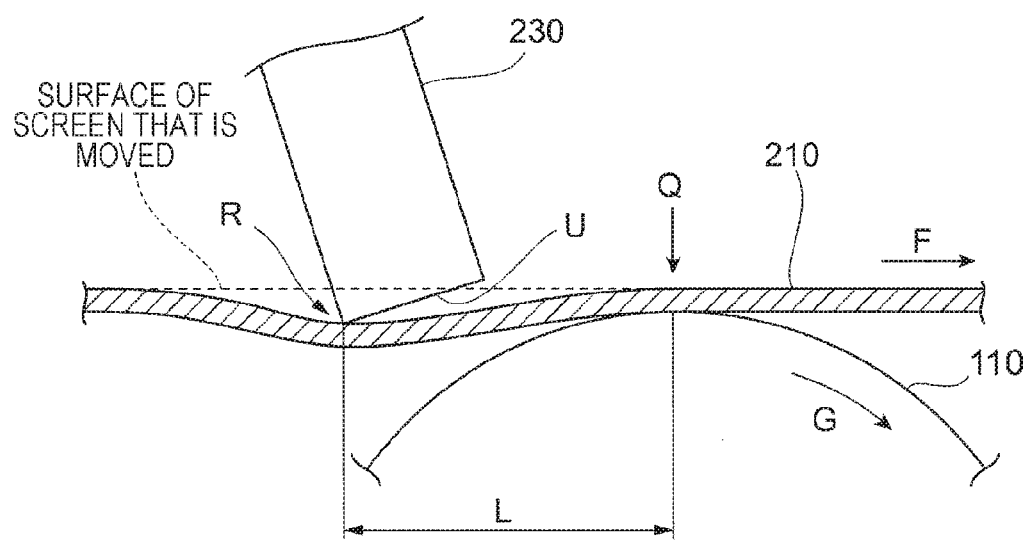
FIG. 12A is an enlargement of a printing area in a case where the screen printing device according to the second exemplary embodiment performs screen printing.
Figure 12B:
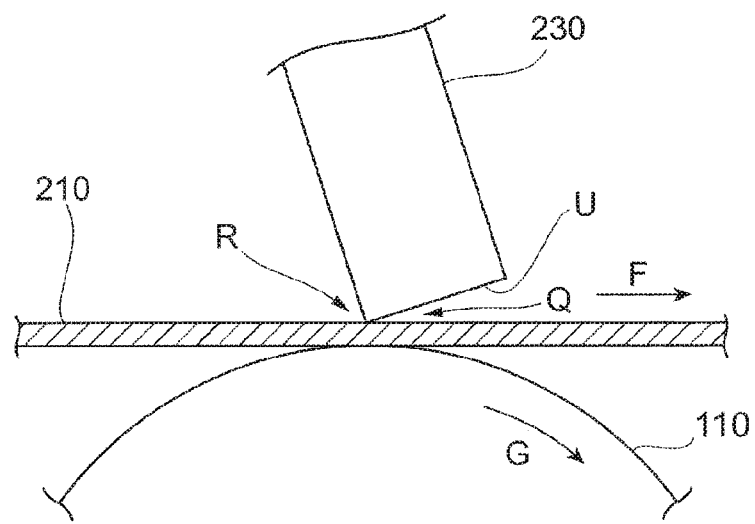
FIG. 12B is an enlargement of a printing area in a case where a screen printing device according to a related art performs screen printing.

FIG. 12A is an enlargement of a printing area in a case where the screen printing device 200 according to the second exemplary embodiment performs screen printing. FIG. 12B is an enlargement of a printing area in a case where a screen printing device according to a related art performs screen printing.

In screen printing, the squeegee 230 presses the screen 210, whereby the resistive-heating-body paste Tp is pressed, and the openings of the screen 210 are filled with the resistive-heating-body paste Tp. Then, the resistive-heating-body paste Tp in the openings moves from the screen 210 to the substrate 110. Thus, the resistive-heating-body paste Tp is transferred to the substrate 110.

FIGS. 12A and 12B illustrate a supplying position R (hereinafter referred to as contact position R) where the resistive-heating-body paste Tp is supplied into the openings of the screen 210, and a transfer position Q where the resistive-heating-body paste Tp is transferred to the substrate 110. The transfer position Q is a position where the screen 210 and the substrate 110 are in contact with each other. In FIGS. 12A and 12B, the resistive-heating-body paste Tp is not illustrated.

As illustrated in FIG. 12B illustrating the screen printing device according to the related art, the contact position R between the squeegee 230 and the screen 210 is across the screen 210 from the highest point of the substrate 110, and the contact position R coincides with the transfer position Q. Furthermore, the contact position R is at a corner of a bottom surface U of the squeegee 230.

Usually, the squeegee 230 does not tends to extend linearly but to be distorted at the contact position R. Specifically, the bottom surface U of the squeegee 230 cockles in the axial direction (the depth direction in FIGS. 12A and 12B and the lateral direction in FIG. 11A). Therefore, the shape of the squeegee 230 at the corner of the bottom surface U, i.e., at the contact position R, does not tend to be linear, causing variations in the thickness of the film of application liquid applied to the substrate 110. Such a phenomenon is more pronounced as the curvature of the substrate 110 increases.

In contrast, as illustrated in FIG. 12A illustrating the screen printing device 200 according to the second exemplary embodiment, the squeegee 230 is in contact with the screen 210 at a position on the upstream side with respect to the transfer position Q in the direction of movement of the screen 210. In such a configuration, the side of the screen 210 that faces the substrate 110 is out of contact with the substrate 110 at the contact position R between the squeegee 230 and the screen 210. That is, the contact position R between the squeegee 230 and the screen 210 does not coincide with the transfer position Q and is at a distance L from the transfer position Q toward the upstream side in the direction of movement of the screen 210. If, for example, the squeegee angle θ is 70° and the surface of the substrate 110 that carries the resistive heating bodies 120 has a shape corresponding to a part of a cylinder having a diameter of 30 mm, the distance L is preferably 1 mm to 15 mm or more preferably 3 mm to 10 mm.

Since the squeegee 230 is provided at a position shifted from the position specified in the related art, the influence of the shape of the squeegee 230 at the contact position R upon the pressure applied to the screen 210 is small. Hence, the variation, in the axial direction, in the pressure applied from the squeegee 230 to the screen 210 is reduced, and the thickness of the film of application liquid formed on the substrate 110 tends to become more uniform.

If the substrate 110 is flat, normal screen printing for a flat surface is performed. In such a case, the variation in the film thickness tends to be small, and the problem is not likely to occur. This is because, in normal screen printing, since the squeegee 230 itself moves, the pressure distribution is not likely to change. However, since the substrate 110 according to the second exemplary embodiment has a curved printing surface, the squeegee 230 is stationary. Therefore, the cockling of the bottom surface U of the squeegee 230 is more influential, and the variation in the film thickness is likely to become larger. If the variation in the film thickness is large, the resistance values of the resistive heating bodies 120 vary with the positions of the resistive heating bodies 120. Consequently, the temperatures of the resistive heating bodies 120 vary with the positions of the resistive heating bodies 120, and nonuniformity in the fixing process occurs.

In contrast, in the case illustrated in FIG. 12A where the squeegee 230 is shifted from the position specified in the related art, the influence of the cockling of the bottom surface U of the squeegee 230 is reduced. Consequently, the variation in the thickness of the film of application liquid applied to the substrate 110 is reduced. Accordingly, the variation in the resistance values of the resistive heating bodies 120 at different positions is reduced. Consequently, the variation in the temperatures of the resistive heating bodies 120 at different positions is reduced, suppressing the occurrence of nonuniformity in the fixing process.

As illustrated in FIG. 12A, the squeegee 230 may be in contact with the screen 210 at a position nearer to the substrate 110 than the original surface of the screen 210 that is yet to be pressed. In such a configuration, a force of pressing the screen 210 is assuredly applied to the screen 210.

Now, an operation of the screen printing device 200 will be described.

Figure 13:
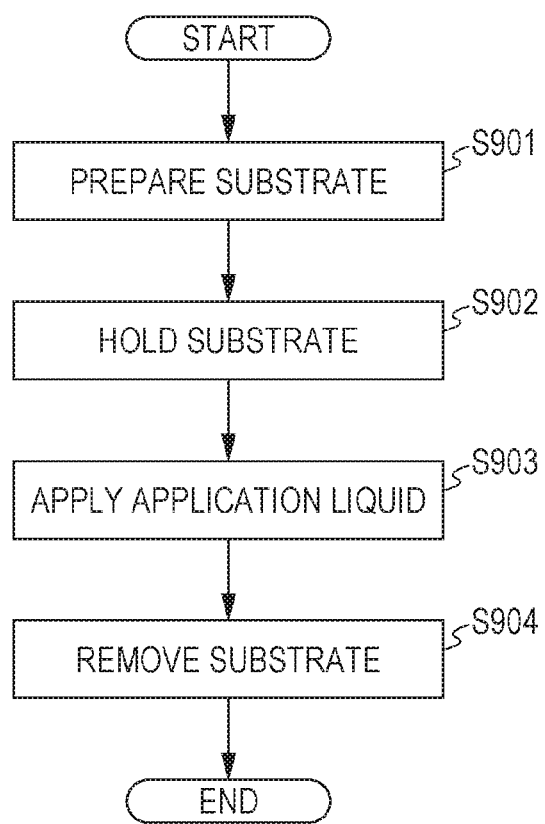
FIG. 13 is a flow chart illustrating a process of performing screen printing by using the screen printing device according to the second exemplary embodiment.

FIG. 13 is a flow chart illustrating a process of performing screen printing by using the screen printing device 200. The process will be described with reference to FIGS. 11A, 11B, and 13.

The following description concerns an exemplary case where the resistive-heating-body paste Tp as application liquid is applied to the substrate 110 in the step of forming heating bodies, i.e., step S301 illustrated in FIG. 6.

First, a substrate 110 is prepared (step S901). As described above, the substrate 110 has a curved outer peripheral surface. The substrate 110 in this state already has the insulating layer 160 formed in step S200 illustrated in FIG. 6.

Subsequently, the substrate 110 is set on the substrate holder 250 (step S902).

Then, the resistive-heating-body paste Tp as application liquid is ejected from an application-liquid-ejecting portion (not illustrated) while the substrate holder 250 is rotated in a direction of arrow G illustrated in FIG. 11B and the screen holder 220 is moved in a direction of arrow F illustrated in FIG. 11B (toward the right side in FIG. 11B) (step S903). Thus, the substrate 110 rotates in the direction of arrow G, and the screen 210 moves in the direction of arrow F. Consequently, the application liquid is transferred to the substrate 110. Thus, screen printing is performed.

Then, the substrate 110 is removed from the substrate holder 250, and the screen holder 220 and the substrate holder 250 are moved in respective directions that are opposite to the directions of arrow F and arrow G, whereby the screen holder 220 and the substrate holder 250 are returned to the respective initial positions thereof (step S904).

Figure 14A:
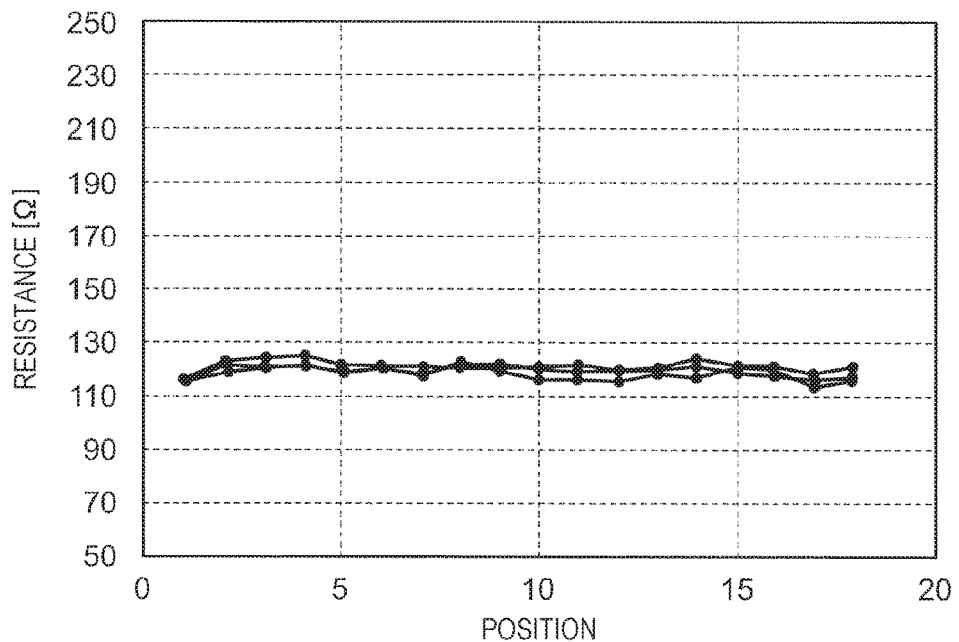
FIG. 14A is a graph illustrating the variation in the resistance value of resistive heating bodies in the screen printing device according to the second exemplary embodiment.
Figure 14B:
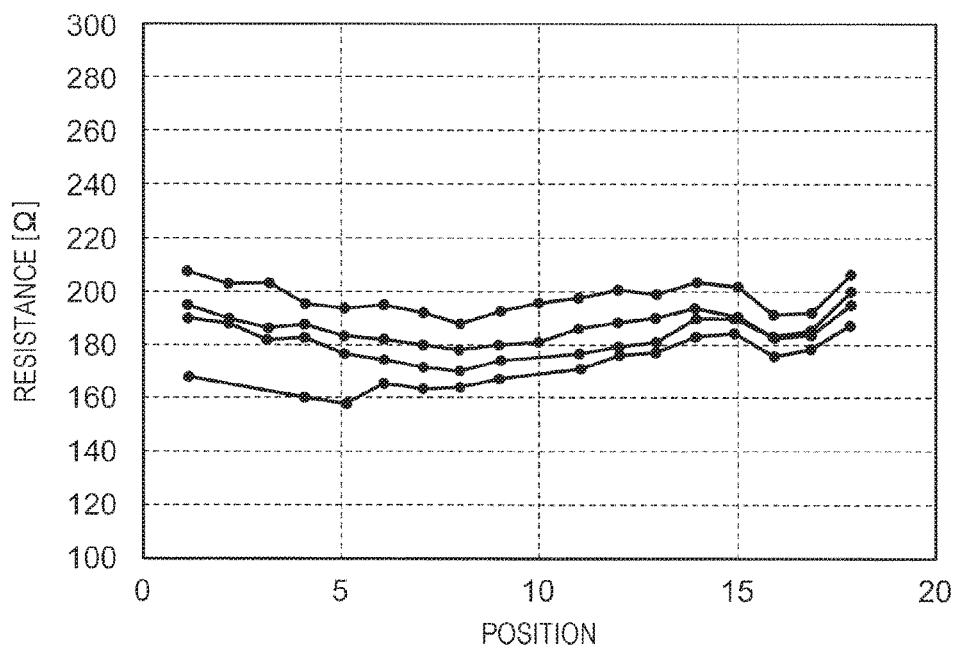
FIG. 14B is a graph illustrating the variation in the resistance value of resistive heating bodies in the screen printing device according to the related art.

FIG. 14A is a graph illustrating the variation in the resistance values of the resistive heating bodies 120 in the screen printing device 200 according to the second exemplary embodiment. FIG. 14B is a graph illustrating the variation in the resistance values of the resistive heating bodies 120 in the screen printing device according to the related art. In each of the graphs, the horizontal axis represents the axial position of the substrate 110, and the vertical axis represents the resistance value. Each of the graphs include four curves, which show four patterns of variations in the resistance values measured after each of four performances of the formation of the resistive heating bodies 120.

Comparing the two graphs illustrated in FIGS. 14A and 14B, it is obvious that the variation in the resistance values in the axial direction of the substrate 110 is smaller in the graph illustrated in FIG. 14A than in the graph illustrated in FIG. 14B. This is because of the following. The variation in the thicknesses of the resistive heating bodies 120 with respect to the positions of the resistive heating bodies 120 is smaller in the case graphed in FIG. 14A than in the case graphed in FIG. 14B. Hence, the variation in the resistance values of the resistive heating bodies 120 with respect to the positions of the resistive heating bodies 120 is smaller in the case graphed in FIG. 14A than in the case graphed in FIG. 14B. The variation in the resistance values is about ±10% in the case graphed in FIG. 14B, but is about ±2% in the case graphed in FIG. 14A.

Furthermore, while almost none of the four curves in FIG. 14B overlap one another, the four curves in FIG. 14A overlap one another almost over the entirety thereof. In the case graphed in FIG. 14B, as a result of performing the formation of the resistive heating bodies 120 plural times, the thicknesses of the resistive heating bodies 120 have varied, which further varies the resistance values of the resistive heating bodies 120. In contrast, in the case graphed in FIG. 14A, the thicknesses of the resistive heating bodies 120 show almost no variations even after plural performances of the formation of the resistive heating bodies 120. Hence, the resistance values of the respective resistive heating bodies 120 are almost the same.

While the second exemplary embodiment described above concerns a case where the resistive-heating-body paste Tp as application liquid is applied to the substrate 110 by screen printing in the step of forming the resistive heating bodies 120, the present invention is not limited to such a case. For example, the above second exemplary embodiment is also applicable to another case where, for example, the glass paste is applied to the substrate 110 by screen printing in the step of forming an insulating layer.

While the above second exemplary embodiment concerns a case where screen printing is performed in manufacturing the solid heater 71, the present invention is not limited to such a case. The second exemplary embodiment is also applicable to another case, as long as screen printing is performed on a curved surface. For example, the screen printing device 200 according to the second exemplary embodiment may be used as a device that performs screen printing on a printing object, such as a can, having a curved surface. In that case, the screen printing device 200 is regarded as a screen printing device including a screen 210 that is movable in a predetermined direction in such a manner as to follow the rotating printing object having a curved surface, and a squeegee 230 (an exemplary pressing member) that is provided at a position across the screen 210 from the printing object and is in contact with the screen at a position on the upstream side with respect to the transfer position in the direction of movement of the screen 210, the squeegee 230 pressing the screen 210 toward the printing object so that a colorant such as ink is transferred to the printing object through the screen 210.

A method of manufacturing printed matter by using the screen printing device 200 includes a step of preparing a printing object having a curved surface, and a step of performing screen printing in which the screen 210 is moved while the printing object is rotated, with the screen 210 being pressed toward the printing object by the squeegee 230 (an exemplary pressing member) such that a colorant such as ink is transferred to the printing object through the screen 210. The step of performing screen printing is regarded as a method of manufacturing printed matter, in which the squeegee 230 is brought into contact with the screen 210 at a position on the upstream side with respect to the transfer position in the direction of movement of the screen 210.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A method of manufacturing a heating device, comprising:
   preparing a substrate having a curved surface; and
   forming a heating body on the substrate, the heating body configured to generate heat with a supply of electric current, the forming of the heating body including
   pressing a screen toward the substrate with an aid of a pressing member while rotating the substrate and moving the screen, and
   transferring application liquid at a transfer position in which the screen and substrate are in contact to form the heating body to the substrate through the screen
   wherein, in the forming of the heating body, the pressing member is in contact with the screen at a position on an upstream side with respect to the transfer position in a direction of movement of the screen.

2. The method according to claim 1, wherein the pressing member is in contact with the screen at a position nearer to the substrate where the screen is pressed than an uncontacted surface of the screen that is yet to be pressed.

3. The method according claim 1, wherein the curved surface of the substrate has a substantially flat portion and a recess carrying the heating body, and
   wherein the heating body is formed on the substantially flat portion.

4. The method according to claim 3, further comprising:
   mounting a resistive element in the recess of the substrate, the resistive element having a positive temperature coefficient and being connected in series to the heating body; and
   forming a protective layer over the heating body and the resistive element, the protective layer protecting the heating body and the resistive element.

* * * * *